United States Patent
Zhang et al.

(10) Patent No.: US 12,211,966 B2
(45) Date of Patent: Jan. 28, 2025

(54) LIGHT-EMITTING COMPONENT COMPRISING FLUORINE-CONTAINING REGION WITH IMPROVED CURRENT SPREAD AND LIGHT DISPERSION

(71) Applicant: Tianjin Sanan Optoelectronics Co., Ltd., Tianjin (CN)

(72) Inventors: Dongyan Zhang, Tianjin (CN); Yuehua Jia, Tianjin (CN); Chun-Yi Wu, Tianjin (CN); Wen Liu, Tianjin (CN); Jing Wang, Tianjin (CN); Huan-Shao Kuo, Tianjin (CN); Huiwen Li, Tianjin (CN); Duxiang Wang, Tianjin (CN)

(73) Assignee: Tianjin Sanan Optoelectronics Co., Ltd., Tianjin (CN)

( * ) Notice: Subject to any disclaimer, the term of this patent is extended or adjusted under 35 U.S.C. 154(b) by 475 days.

(21) Appl. No.: 17/527,033

(22) Filed: Nov. 15, 2021

(65) Prior Publication Data
US 2022/0077370 A1    Mar. 10, 2022

Related U.S. Application Data

(63) Continuation-in-part of application No. PCT/CN2019/087486, filed on May 17, 2019, and a
(Continued)

(51) Int. Cl.
*H01L 33/62* (2010.01)
*H01L 33/00* (2010.01)
(Continued)

(52) U.S. Cl.
CPC .......... *H01L 33/62* (2013.01); *H01L 33/005* (2013.01); *H01L 33/10* (2013.01); *H01L 33/382* (2013.01);
(Continued)

(58) Field of Classification Search
CPC ............ H01L 33/62; H01L 2933/0066; H01L 33/382; H01L 2933/0016; H01L 33/10; H01L 33/405; H01L 33/42
(Continued)

(56) References Cited

U.S. PATENT DOCUMENTS

| | | | |
|---|---|---|---|
| 2008/0124823 A1 | 5/2008 | Ko et al. | |
| 2011/0284822 A1* | 11/2011 | Jung | H01L 33/56 |
| | | | 257/E33.012 |

FOREIGN PATENT DOCUMENTS

| | | | | |
|---|---|---|---|---|
| CN | 101626057 | * | 1/2010 | ............ H01L 33/00 |
| CN | 101626057 A | | 1/2010 | |
(Continued)

OTHER PUBLICATIONS

Search Report issued to PCT application No. PCT/CN2019/087486 on Feb. 19, 2020.
(Continued)

*Primary Examiner* — Didarul A Mazumder
(74) *Attorney, Agent, or Firm* — MUNCY, GEISSLER, OLDS & LOWE, P.C.

(57) ABSTRACT

A light-emitting component includes a light-emitting unit and an electrically insulating layer. The light-emitting unit includes a first semiconductor layer, an active layer, and a second semiconductor layer, which are stacked on one another along a stacking direction in such order. The second semiconductor has a lower surface distal from the active layer. The electrically insulating layer is disposed to cover a first portion and to expose a second portion of the lower surface of the second semiconductor layer. A fluorine-containing region is formed in the second semiconductor layer. Methods for making the light-emitting component are also disclosed.

17 Claims, 17 Drawing Sheets

Related U.S. Application Data continuation-in-part of application No. PCT/CN2019/087487, filed on May 17, 2019.

(51) Int. Cl.
*H01L 33/10* (2010.01)
*H01L 33/38* (2010.01)

(52) U.S. Cl.
CPC ............... *H01L 2933/0016* (2013.01); *H01L 2933/0066* (2013.01)

(58) Field of Classification Search
USPC .............................................. 257/79; 438/22
See application file for complete search history.

(56) References Cited

FOREIGN PATENT DOCUMENTS

| CN | 107403860 | * 11/2017 | ............. H01L 33/46 |
| CN | 107403860 A | 11/2017 | |

OTHER PUBLICATIONS

Search Report issued to PCT application No. PCT/CN2019/087487 on Feb. 14, 2020.

* cited by examiner

LIGHT-EMITTING COMPONENT COMPRISING FLUORINE-CONTAINING REGION WITH IMPROVED CURRENT SPREAD AND LIGHT DISPERSION

CROSS-REFERENCE TO RELATED APPLICATION

This application is a bypass continuation-in-part (CIP) application of PCT International Application Nos. PCT/CN2019/087486 and PCT/CN2019/087487, filed on May 17, 2019. The entire content of both of the international patent applications is incorporated herein by reference.

FIELD

The disclosure relates to a light-emitting component, and more particularly to a light-emitting component with improved current distribution and a method for making the same.

BACKGROUND

At present, light-emitting diodes (LEDs) have been widely applied in various fields, such as lighting, display, traffic signs, data storage, and medical equipment, etc. Many factors affect the efficiency of LED light-emitting components, including the internal quantum efficiency (IQE) of the epitaxial structure, heat dissipation of the substrate, and luminous exitance of the light-exiting surface, etc.

Referring to FIG. 1, a conventional light-emitting component 1 includes an epitaxial structure 11 and an electrically insulating layer 12. The epitaxial structure 11 includes a first conductivity type semiconductor layer 111, an active layer 112, and a second conductivity type semiconductor layer 113, which are stacked along an up-down direction on one another in such order. The second conductivity type semiconductor layer 113 has a lower surface distal from the active layer 112.

A first portion of the lower surface of the second conductivity type semiconductor layer 113 is covered by the electrically insulating layer 12, and a second portion of the lower surface of the second conductivity type semiconductor layer 113 is uncovered by the electrically insulating layer 12. An electric current is permitted to flow through the second portion of the second conductivity type semiconductor layer 113. The electrically insulating layer 12 may include silicon oxide, silicon nitride, calcium fluoride, or magnesium fluoride. A plurality of through holes are formed in the electrically insulating layer 12, and are positioned to correspond to the second portion of the lower surface of the second conductivity type semiconductor layer 113.

The conventional light-emitting component 1 further includes a first electrode 14 that is arranged on an upper surface of the first conductivity type semiconductor layer 111 distal from the active layer 112 and that has a main pad electrode 140 and an extended electrode strip (not shown). The main pad electrode 140 is used for external electrical connection, and is generally circular-shaped or elliptically-shaped (see FIG. 2).

The conventional light-emitting component 1 further includes a contact layer 13 and a second electrode 15, which are sequentially formed on the electrically insulating layer 12 distal from the epitaxial structure 11. The arrows shown in FIG. 1 indicate a transmission route of the electric current injected into the conventional light-emitting component 1. The current inputs into the light-emitting component 1 from the second electrode 15, transmits through the contact layer 13 into the epitaxial structure 11, and outputs from the main pad electrode 140 of the first electrode 14.

Since the main pad electrode 140 of the first electrode 14 serves as a current accumulation region, in order to prevent the current from flowing vertically through the epitaxial structure 11 in a shortest path, the locations of the through holes are staggered from the main pad electrode 140 in the up-down direction. That is, the lower surface of the second conductivity type semiconductor layer 113 in a position corresponding to the main pad electrode 140 is covered by the electrically insulating layer 12.

It is noted that, from the structure of the conventional light-emitting component 1, although the electrically insulating layer 12 may be used for dispersing the current in the epitaxial structure 11, the current paths are still conspicuously concentrated under or near the main pad electrode 140.

In order to improve heat dissipation of the light-emitting component 1, an epitaxial growth substrate (not shown) for growing the epitaxial structure 11 can be removed and replaced with a substrate having a higher thermal conductivity. Since silicon, silicon carbide, or metal has a thermal conductivity higher than that of gallium arsenide, the current commercial method adopts a bonding process to replace the epitaxial growth substrate with a substrate made of silicon, silicon carbide, or metal. However, after replacing the epitaxial growth substrate with the substrate having a higher thermal conductivity, the position of the first conductivity type semiconductor layer 111 (e.g., an n-type epitaxial layer) of the light-emitting component 1 would change from being the lowermost to the uppermost in the light-emitting component 1, and thus, disposing a contact layer and the first electrode 14 on the n-type epitaxial layer 111 might result in electrode shading (i.e., light exiting the light-emitting component 1 being blocked by the first electrode 14).

On the other hand, in order to improve luminous exitance of the light-emitting component 1, a metallic reflective layer (not shown) can be included in the light-emitting component 1. By combining the metallic reflective layer and the electrically insulating layer 12, the reflection effect can be greatly improved. At present, the refractive index of the epitaxial structure 11 ranges from about 2.5 to about 3.0. The electrically insulating layer 12 is typically transparent and has a refractive index lower than that of the epitaxial structure 11. The electrically insulating layer 12 is usually disposed between the metallic reflective layer (not shown) and the epitaxial structure 11, so that light emitted from the epitaxial structure 11 that has a large angle of incidence can be totally internally reflected at the interface between the electrically insulating layer 12 and the epitaxial structure 11 and can be reflected back to the epitaxial structure 11. Moreover, light emitted from the epitaxial structure 11 that has a small angle of incidence (i.e., an angle of incidence less than the critical angle) will continue to pass through the electrically insulating layer 12 and arrive at the metallic reflective layer, where the light is reflected back to the epitaxial structure 11 and eventually exits the light-emitting component 11 from the light-exiting surface of the epitaxial structure 11.

Therefore, the transparency and refractive index of the electrically insulating layer 12 are the main factors that affects the reflectance and the luminance exitance of the light-emitting component 1. Currently, the electrically insulating layer 12 generally has a refractive index lower than 2.0, and is made of a material including one of silicon nitride, silicon oxide, magnesium fluoride, calcium fluoride, or the like, or combinations thereof.

SUMMARY

Therefore, an object of the disclosure is to provide a light-emitting component that can alleviate at least one of the drawbacks of the prior art. A method for making the light-emitting component is also provided. In this disclosure, the light-emitting component is provided with an improved current spread and light dispersion.

According to a first aspect of the disclosure, a light-emitting component includes a light-emitting unit and an electrically insulating layer.

The light-emitting unit includes a first semiconductor layer, an active layer, and a second semiconductor layer, which are stacked on one another along a stacking direction in such order. The second semiconductor layer has a lower surface distal from the active layer. The first semiconductor layer has a conductivity type different from that of the second semiconductor layer. The electrically insulating layer is disposed to cover a first portion of the lower surface of the second semiconductor layer and to expose a second portion of the lower surface of the second semiconductor layer such that an electric current is permitted to flow outwardly from the lower surface of the second semiconductor layer through the second portion. A fluorine-containing region is formed in the second semiconductor layer.

According to a second aspect of the disclosure, a method for making a light-emitting component includes the steps of:
forming a light-emitting unit that includes a first semiconductor layer, an active layer, and a second semiconductor layer, which are stacked on one another along a stacking direction in such order, the first semiconductor layer having a conductivity type different from that of the second semiconductor layer;
forming an electrically insulating layer on a lower surface of the second semiconductor layer distal from the active layer so as to cover a first portion of the lower surface of the second semiconductor layer and to expose a second portion of the lower surface of the second semiconductor layer, the electrically insulating layer including fluoride;
subjecting the light-emitting unit and the electrically insulating layer to a heating treatment so as to permit fluorine inside the electrically insulating layer to diffuse into the second semiconductor layer, thereby forming a fluorine-containing region inside the second semiconductor layer; and
forming a first electrode and a second electrode such that the first electrode is electrically connected to the first semiconductor layer and the second electrode is electrically connected to the second semiconductor layer.

According to a third aspect of the disclosure, a method for making a light-emitting component includes the steps of:
forming a light-emitting unit that includes a first semiconductor layer, an active layer, and a second semiconductor layer, which are stacked on one another along a stacking direction in such order, the first semiconductor layer having a conductivity type different from that of the second semiconductor layer;
forming a plurality of ohmic contact blocks on a lower surface of the second semiconductor layer distal from the active layer;
forming an electrically insulating layer to cover the lower surface of the second semiconductor layer exposed from the ohmic contact blocks, the electrically insulating layer being made of a material including metal fluoride;
subjecting the light-emitting unit, the ohmic contact blocks, and the electrically insulating layer to a heating treatment so that fluorine in the electrically insulating layer diffuses into the second semiconductor layer, thereby forming a fluorine-containing region in the second semiconductor layer; and
forming a first electrode and a second electrode such that the first electrode is electrically connected to the first semiconductor layer, and the second electrode is electrically connected to the second semiconductor layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
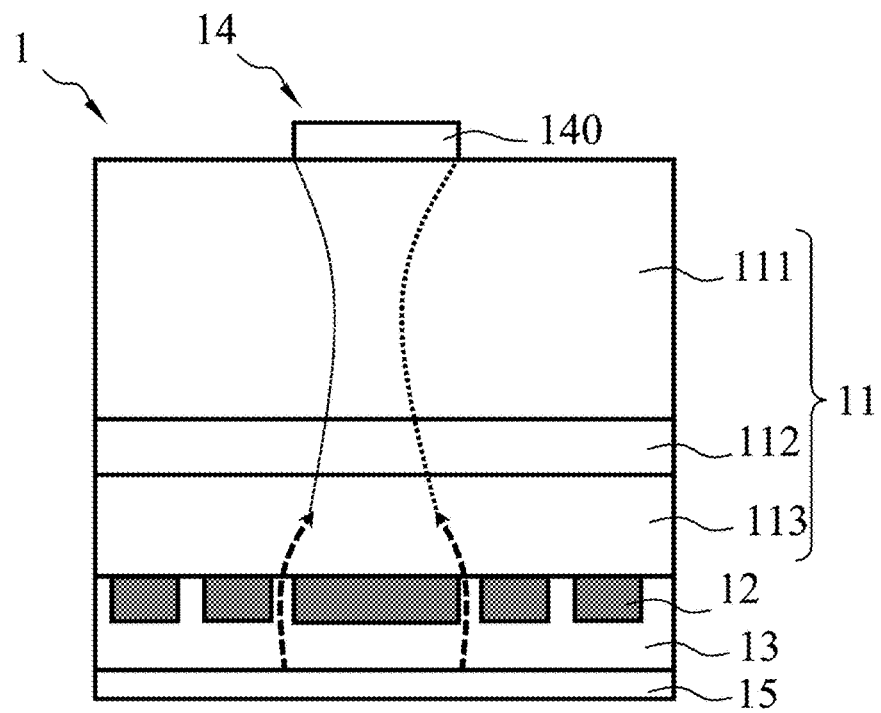
FIG. 1 is a schematic view illustrating a conventional light-emitting component.
Figure 2:
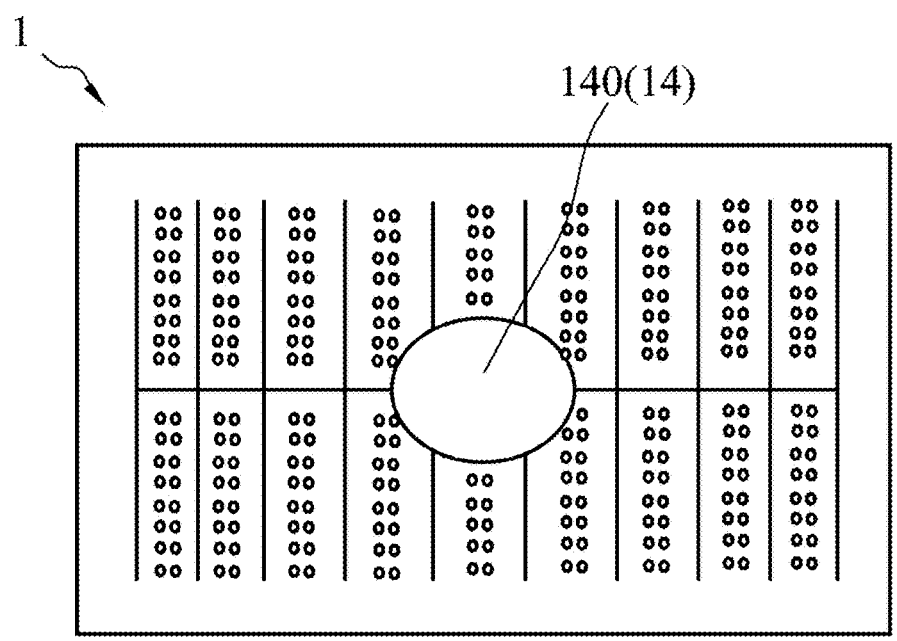
FIG. 2 is a top view of the conventional light-emitting component.

Before the disclosure is described in greater detail, it should be noted that where considered appropriate, reference numerals or terminal portions of reference numerals have been repeated among the figures to indicate corresponding or analogous elements, which may optionally have similar characteristics.

To aid in describing the disclosure, directional terms may be used in the specification and claims to describe portions of the present disclosure (e.g., upper, lower, top, bottom, up, down, beneath, under, etc.). These directional definitions are intended to merely assist in describing and claiming the disclosure and are not intended to limit the disclosure in any way.

Figure 3:
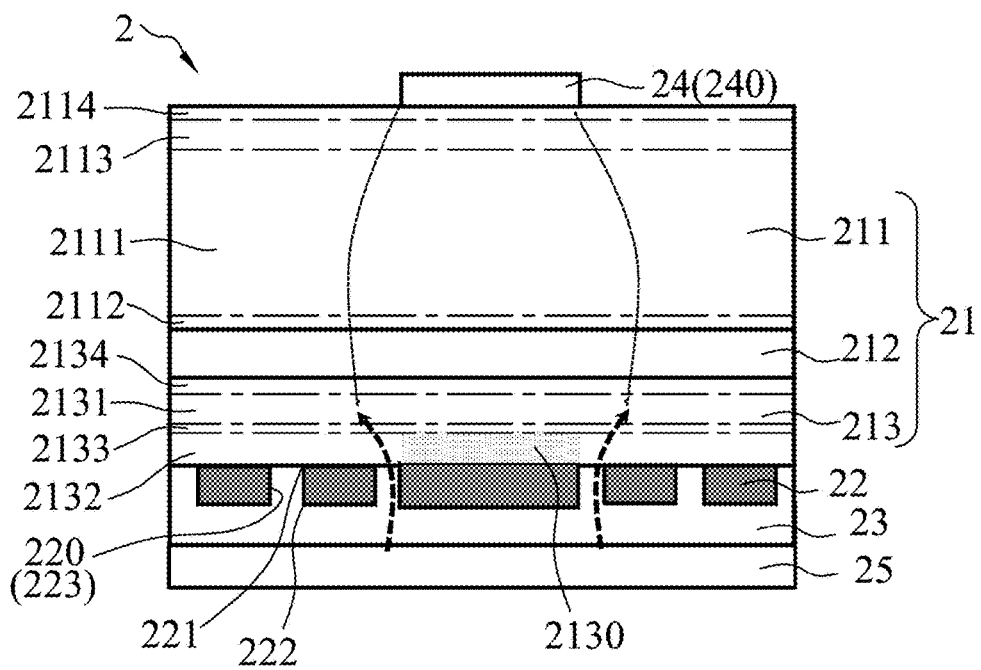
FIG. 3 is a schematic view illustrating a first embodiment of the light-emitting component according to the present disclosure.

Referring to FIG. 3, a first embodiment of a light-emitting component 2 according to the present disclosure includes a light-emitting unit 21 and an electrically insulating layer 22. The light-emitting unit 21 includes a first semiconductor layer 211, an active layer 212, and a second semiconductor layer 213, which are stacked on one another along a stacking direction in such order. The second semiconductor layer 213 has a lower surface distal from the active layer 212.

The first semiconductor layer 211 has a conductivity type different from that of the second semiconductor layer 213. The first semiconductor layer 211 may be one of an n-type semiconductor layer and a p-type semiconductor layer, and the second semiconductor layer 213 may be one of a p-type semiconductor layer and an n-type semiconductor layer. In this embodiment, the first semiconductor layer 211 is an n-type semiconductor layer, and the second semiconductor layer 213 is a p-type semiconductor layer. In alternative embodiments, the first semiconductor layer 211 may be a p-type semiconductor layer, and the second semiconductor layer 213 may be an n-type semiconductor layer. In some embodiments, the first semiconductor layer 211, the active layer 212, and the second semiconductor layer 213 includes one of $Al_xIn_yGa_{1-x-y}P$ and $Al_zGa_{1-z}As$, in which $0 \leq x \leq 1$, $0 \leq y \leq 1$, and $0 \leq z \leq 1$.

In some embodiments, the first semiconductor layer 211 may further include an n-type cladding layer 2111, and the second semiconductor layer 213 may further include a p-type cladding layer 2131. The active layer 212 is disposed between the n-type cladding layer 2111 and the p-type cladding layer 2131, and can emit a predetermined wavelength of light. The active layer 212, the n-type cladding layer 2111, and the p-type cladding layer 2131 are made from III-V compound semiconductors. To be specific, the III-V compound semiconductors may be binary compound semiconductors (such as, but not limited to, GaAs-based, GaP-based, and InP-based semiconductors), ternary compound semiconductors (such as, but not limited to, InGaAs-based, AlInP-based, and AlGaAs-based semiconductors), or quaternary compound semiconductors (such as, but not limited to, AlGaInP-based semiconductors). It should be noted that the active layer 212, the n-type cladding layer 2111, and the p-type cladding layer 2131 may be made of the same semiconductor material but having different doping types. For example, when the active layer 212 is made of an undoped AlGaInP-based semiconductor, the n-type cladding layer 2111 and the p-type cladding layer 2131 are respectively made of n-doped and p-doped AlGaInP-based semiconductors.

The p-type cladding layer 2131 provides electron holes, and the n-type cladding layer 2111 provides electrons. The wavelength of light emitted by the active layer 212 can be adjusted to be between that of visible light (e.g., red, yellow, or green light) and that of non-visible light (e.g., infrared light) by modulating the composition of the active layer 212. In this embodiment, the n-type cladding layer 2111 is a Si-doped AlInP layer, and has a thickness ranging from about 50 nm to about 5000 nm. The p-type cladding layer 2131 is an Mg-doped AlInP layer, and has a thickness ranging from about 50 nm to about 5000 nm. The active layer 212 has a multi-quantum well (MQW) structure, and includes AlGaInP. The MQW structure may include 2 pairs to 50 pairs of AlGaInP MQWs.

In some embodiments, the first semiconductor layer 211 further includes an n-type depletion layer 2112 disposed between the n-type cladding layer 2111 and the active layer 212 so as to prevent Si inside the n-type cladding layer 2111 from entering into the active layer 212 and affecting the performance of the light-emitting component 2. The n-type depletion layer 2112 may include at least one of AlInP and AlGaInP, and have a thickness ranging from 0 to about 1000 nm. The first semiconductor layer 211 may further include an n-type window layer 2113 for current spreading. The n-type window layer 2113 is disposed on a side of the n-type cladding layer 2111 distal from the active layer 212 and may serve as a light-exiting surface of the light-emitting component 2. The n-type window layer 2113 may include $Al_xGa_{1-x}InP$, and may have a thickness ranging from 0 to about 6000 nm. In some embodiments, the first semiconductor layer 211 may further include an n-type ohmic contact layer 2114 for forming ohmic contact with the first electrode 24. The n-type ohmic contact layer 2114 may be disposed between the n-type window layer 2113 and the first electrode 24, and may be formed to locate directly beneath the first electrode 24. The n-type ohmic contact layer 2114 may include n-doped gallium arsenide (GaAs), and may have a thickness ranging from about 5 nm to about 100 nm.

In some embodiments, the second semiconductor layer 213 further includes a current spreading layer 2132 which has the lower surface of the second semiconductor layer 213. The current spreading layer 2132 may be, for example, but not limited to, a p-doped gallium phosphide (GaP) layer or a p-doped GaAs layer. In some embodiments, the current spreading layer 2132 includes one of GaP, GaAs, and AlGaInP.

The current spreading layer 2132 has a doping concentration of at least $8E^{17}$ atoms/cm$^3$, and the current spreading layer 2132 may be doped with, for example, but not limited to, Mg, Zn, or C. The current spreading layer 2132 may have a thickness ranging from about 5 nm to about 5000 nm. In some embodiments, second semiconductor layer 213 may further include a transition layer 2133 for cohesion of the current spreading layer 2132 and the p-type cladding layer 2131, which improves a lattice quality of the current spreading layer 2132. The transition layer 2133 may include AlGaInP, and may have a thickness ranging from about 3 nm to about 100 nm. In some embodiments, the second semiconductor layer 213 may further include a p-type depletion layer 2134 disposed between the p-type cladding layer 2131 and the active layer 212 to prevent the Mg inside the p-type cladding layer 2131 from entering into the active layer 212 and affecting the performance of the light-emitting component 2. The p-type depletion layer 2134 may have a thickness ranging from 0 nm to about 1000 nm, and may include at least one of AlInP and AlGaInP.

The electrically insulating layer 22 is disposed to cover a first portion of the lower surface of the second semiconductor layer 213 and to expose a second portion of the lower surface of the second semiconductor layer 213, such that an electric current is permitted to flow outwardly from the lower surface of the second semiconductor layer 213 through the second portion. In some embodiments, the electrically insulating layer 22 is made of a material with a low refractive index ranging between 1.2 and 1.5. In some embodiments, the electrically insulating layer 22 includes a fluoride material such as magnesium fluoride ($MgF_2$) or gallium fluoride ($GaF_3$), which can be obtained by electron beam evaporation or high temperature vapor deposition.

Different vapor deposition methods or parameters, such as temperature, can cause the electrically insulating layer 22 to have a different refraction index. Typically, fluorides have a lower refraction index than oxides (e.g., silicon oxide) or nitrides (e.g., silicon nitride), therefore, when light is emitted from the active layer 212 of the light-emitting unit 21, total internal reflection rate increases when light arrives at the interface between the electrically insulating layer 22 and the light-emitting unit 21. In some embodiments, the electrically insulating layer 22 has a thickness ranging between about 0.1 nm and about 500 nm. In some embodiments, the thickness of the electrically insulating layer 22 may range between about 10 nm and about 500 nm. In certain embodiments, the thickness of the electrically insulating layer 22 ranges between about 10 nm and about 100 nm.

In order for the electrically insulating layer 22 to cover the first portion of the lower surface of the second semiconductor layer 213 and to expose the second portion of the lower surface of the second semiconductor layer, the electrically insulating layer 22 has a plurality of through holes 220 extending in the stacking direction such that the lower surface of the second semiconductor layer 213 exposed from the through holes 220 serves as the second portion. The through holes 220 are spaced apart and may be formed to be evenly or unevenly located in the electrically insulating layer 22. Each of the through holes 220 has a first opening 221, a second opening 222 opposite to the first opening 221, and a sidewall 223 interconnecting opening edges of the first and second openings 221, 222. The first and second openings 221, 222 are proximate to and distal from the active layer 212, respectively. The first opening 221 has a size which is not greater than that of the second opening 222, and which ranges from about 1 μm to about 20 μm. Since the size of the first opening 221 is not greater than that of the second opening 222, the sidewall 223 of each of the through holes 220 may extend toward the stacking direction in a straight or inclined manner. That is, the sidewall 223 of each of the through holes 220 may have a straight surface or a curved surface (not shown). In some embodiments, as shown in FIG. 3, the first and second openings 221, 222 have the same dimension and the sidewall 223 extends in a straight manner.

Referring further to FIG. 3, a fluorine-containing region 2130 having a current blocking effect is formed in the second semiconductor layer 213 by any possible methods. In this embodiment, the fluorine-containing region 2130 is formed by diffusion of fluorine inside the electrically insulating layer 22 into the second semiconductor layer 213 during a heating treatment. The fluorine-containing region 2130 is formed in a position corresponding to the first portion of the lower surface of the second semiconductor layer 213, and is in contact with the electrically insulating layer 22. In some embodiments, the fluorine-containing region 2130 is formed in the current spreading layer 2132. Through testing, it is found that the fluorine-containing region 2130 can regionally increase a square resistance of the second semiconductor layer 213, and thus, the fluorine-containing region 2130 serves as a relatively high resistance region in the second semiconductor layer 213.

In some embodiments, the light-emitting component 2 further includes a first electrode 24 disposed on an upper surface of the first semiconductor layer 211 distal from the active layer 212. The first electrode 24 includes a main pad electrode 240 for external electrical connection. In this embodiment, a portion of the fluorine-containing region 2130 in the second semiconductor layer 213 is located in alignment with the main pad electrode 240 along the stacking direction.

The arrows shown in FIG. 3 indicate schematically a path of the electric current flowing through the light-emitting component 2. Since the fluorine-containing region 2130 regionally increases the square resistance, the current tends to flow away from the fluorine-containing region 2130 in the second semiconductor layer 213, thereby preventing the current from being concentrated under the main pad electrode 240 of the first electrode 24, and allowing the current to spread laterally in the second semiconductor layer 213, which facilitates uniform distribution of the current and improves uniform dispersion of light.

In some embodiments, as shown in FIG. 3, the light-emitting component 2 may further include an ohmic contact layer 23 disposed on the electrically insulating layer 22 to cover the second portion of the lower surface of the second semiconductor layer 213 exposed from the electrically insulating layer 22. In some embodiments, the ohmic contact layer 23 covers the sidewall 223 of each of the through holes 220. In some embodiments, the ohmic contact layer 23 may be a transparent conductive layer and may include metal or an inorganic metal oxide, such as indium-doped tin oxide (ITO), indium-doped zinc oxide (IZO), or the like. The ohmic contact layer 23 has a thickness that may be selected from among the ranges listed as follows: 0.0001 μm-0.6 μm, 0.0001 μm-0.5 μm, 0.0001 μm-0.4 μm, 0.0001 μm-0.3 μm, 0.0001 μm-0.2 μm, 0.2 μm-0.5 μm, 0.3 μm-0.5 μm, 0.4 μm-0.5 μm, 0.2 μm-0.4 μm, or 0.2 μm-0.3 μm.

In some embodiments, the ohmic contact layer 23 is disposed to electrically connect the second electrode 25 with the second portion of the lower surface of the second semiconductor layer 213 through the through holes 220 of the electrically insulating layer 22. In certain embodiments, the ohmic contact layer 23 includes at least two different metals.

Figure 4:
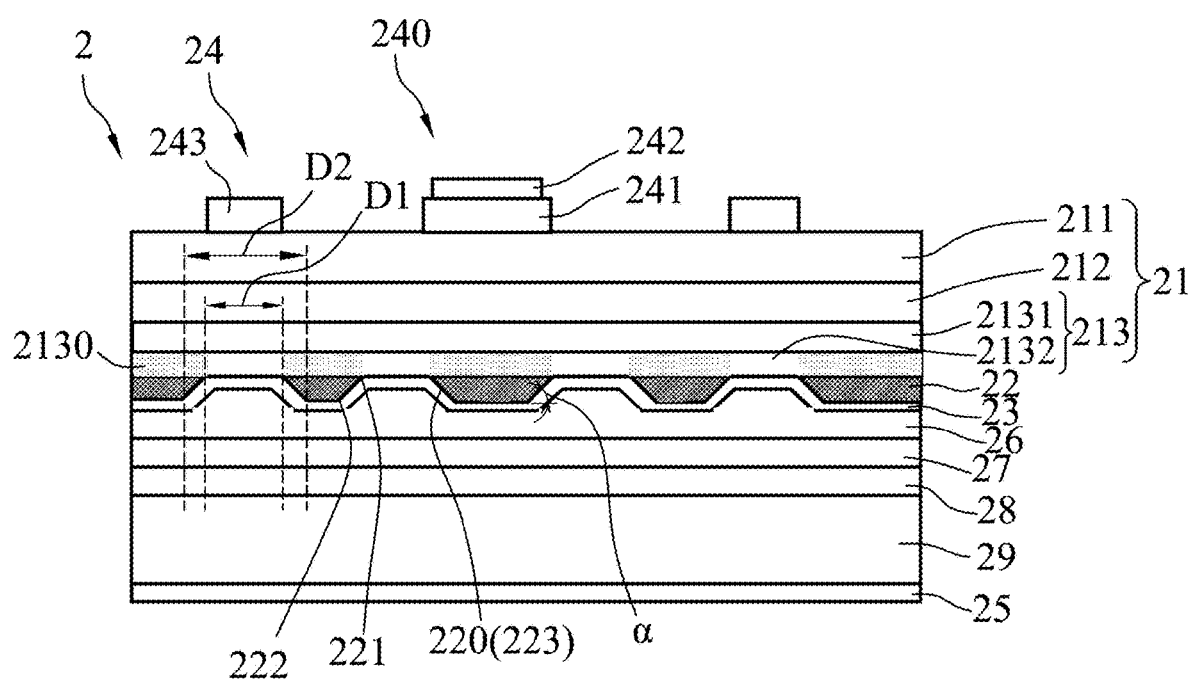
FIG. 4 is a schematic view illustrating a second embodiment of the light-emitting component according to the present disclosure.

In some embodiments, as illustrated in FIG. 3, the light-emitting component 2 may further include a lower metallic layer 25 disposed on a surface of the ohmic contact layer 23 distal from the electrically insulating layer 22. In some embodiments, as illustrated in FIG. 4, the lower metallic layer 25 disposed on the substrate 29 can serve as the second electrode, which is used for external electrical connection. In some embodiments, the second electrode 25 is disposed at a side of the electrically insulating layer 22 distal from the light-emitting unit 21. The first electrode 24 and the second electrode 25 has different polarity, and serve as the current output end and current input end of the light-emitting component 2, respectively.

Referring to FIG. 4, a second embodiment of the light-emitting component 2 is provided. The second embodiment of the light-emitting component 2 is similar to the first embodiment of the light-emitting component 2, except that the second embodiment of the light-emitting component 2 further includes a metallic reflective layer 26, a conductive bonding layer 28, and a substrate 29, which are disposed on the ohmic contact layer 23 in such order (i.e., the layers 26, 28, 29 are positioned between the ohmic contact layer 23 and the second electrode 25). The ohmic contact layer 23 may be a transparent conductive layer.

In some embodiments, the fluorine-containing region 2130 is formed by diffusion of fluorine inside the electrically insulating layer 22 into the second semiconductor layer 213 during a heating treatment. Other suitable method may also be applied for forming the fluorine-containing region 2130. In this embodiment, the fluorine-containing region 2130 is formed to extend from the first portion of the lower surface into the current spreading layer 2132. In this embodiment, the substrate 29 is used for supporting the light-emitting unit 21 and other layers/structures (e.g., the electrically insulating layer 22). The substrate 29 is made of a conductive material. The conductive material may be, for example, but not limited to, metal, metal alloy, silicon, silicon carbide, graphene, etc.

The conductive bonding layer 28 may be a gold-gold bonding layer, a gold-tin bonding layer, a gold-indium bonding layer, or other bonding layers commonly used for bonding processes.

The metallic reflective layer 26 can reflect light emitted from the light-emitting unit 21. The metallic reflective layer 26 may include, for example, but not limited to, copper, aluminum, tin, gold, silver, lead, titanium, nickel, platinum, tungsten, or the like, or combinations thereof. In some embodiments, a blocking layer 27 may be disposed between the metallic reflective layer 26 and the substrate 29, and may be disposed on a lower surface of the metallic reflective layer 26 distal from the electrically insulating layer 22. The blocking layer 27 can prevent the material inside the metallic reflective layer 26 from diffusing toward the substrate 29, thereby avoiding disruption of the structure of the metallic reflective layer 26, and avoiding reduction of reflectivity of the metallic reflective layer 26. In some embodiments, the metallic reflective layer 26 is made of silver, and has a thickness that ranges from about 250 nm to about 750 nm.

For a light not being totally internally reflected by the electrically insulating layer 22, the light travels through the electrically insulating layer 22 and arrives at the metallic reflective layer 26, and is then reflected by the metallic reflective layer 26 back towards the light-emitting unit 21. Therefore, the light can be ensured to emit from an upper surface or a side surface of the light-emitting unit 21, which increases efficiency of the light-emitting component 2.

As shown in FIG. 4, the first opening 221 of each through hole 220 has a first size (D1), and the second opening 222 of the through hole 220 has a second size (D2). The first size (D1) and the second size (D2) define the respective diameter/width of the first opening 221 and the second opening 222. In some embodiments, as shown in FIG. 4, the first size (D1) is smaller than the second size (D2), and the sidewall 223 may have an inclined surface. The electrically insulating layer 22 has a lower surface that is distal from the light-emitting unit 21, and an included angle (a) between the lower surface of the electrically insulating layer 22 and the sidewall 223 of each of the through holes 220 may be larger than 90°. In certain embodiments, the included angle (a) is greater than 90° and is not greater than 170°.

In this embodiment, the ohmic contact layer 23 is disposed between the light-emitting unit 21 and the metallic reflective layer 26. The ohmic contact layer 23 may serve as an adhesion layer which ensures adherence of the metallic reflective layer 26 and the electrically insulating layer 22.

In some embodiments, the first electrode 24 further includes an extension electrode 243 that extends from (not shown in FIG. 4) the main pad electrode 240. The main pad electrode 240 has a plurality of metal layers including a lower contact layer 241 and a wiring connection layer 242. The lower contact layer 241 is provided to form an ohmic contact with the n-type ohmic contact layer 2114 of first semiconductor layer 211. The lower contact layer 241 may include, for example, but not limited to, gold germanium, gold barium, gold germanium nickel, gold zinc, or the like. The wiring connection layer 242 is used for external electrical connection and metal fusion. The wiring connection layer 242 may include, for example, but not limited to, gold, aluminum, copper, or the like. The extension electrode 243 may include gold germanium nickel, gold germanium, or combinations thereof. In some embodiments, other layers, such as a diffusion blocking layer (not shown), may be disposed between the wiring connection layer 242 and the lower contact layer 241 to prevent material inside the lower contact layer 241 from diffusing into the wiring connection layer 242.

As shown in FIG. 4, the metallic reflective layer 26 is disposed between the second electrode 25 and the electrically insulating layer 22 to reflect light from the second semiconductor layer 213.

In this embodiment, the through holes 220 of the electrically insulating layer 22 are staggered from the main pad electrode 240 in the stacking direction so as to further disperse the current paths in the light-emitting component 2. The electrically insulating layer 22 not only covers a region on the second semiconductor layer 213 located in alignment with the main pad electrode 240 in the stacking direction and but also covers other regions on the second semiconductor layer 213. Therefore, in the case that the fluorine-containing region 2130 is formed by diffusion of fluorine inside the electrically insulating layer 22, the fluorine-containing region 2130 extends from an interface between the electrically insulating layer 22 and the second semiconductor layer 213 into the second semiconductor layer 213, and the fluorine-containing region 2130 has at least one part in alignment with the main pad electrode 240 in the stacking direction. The heating treatment used for diffusing the fluorine inside the electrically insulating layer 22 into the second semiconductor layer 213 is performed at a temperature not less than about 300° C. and for a time period ranging between about 0.01 minutes and about 60 minutes. In certain embodiments, the heating treatment is performed at a temperature ranging between about 360° C. and about 600° C. and for a time period ranging between about 0.01 minutes and about 60 minutes. In some other embodiments, the temperature of the heating treatment is not less than about 420° C. In yet some other embodiments, the temperature of the heating treatment ranges from about 460° C. to about 500° C., and the heating treatment is performed for a time period ranging between about 1 minute and about 30 minutes.

By performing the heating treatment, fluorine can diffuse into the second semiconductor layer 213 to form the fluorine-containing region 2130, which increases the square resistance of the second semiconductor layer 213 regionally and forms a region of high resistance in the second semiconductor layer 213. Therefore, the current tends to flow away from the fluorine-containing region 2130 in the second semiconductor layer 213 (i.e., the current flowing along a shortest current path from the ohmic contact layer 23 to the main pad electrode 240 may be greatly reduced). As such, the current may be prevented from being concentrated under the main pad electrode 240 of the first electrode 24 and may be forced to spread laterally in the second semiconductor layer 213, which facilitates uniform distribution of the current and improves uniform dispersion of light.

The fluorine-containing region 2130 is formed in the current spreading layer 2132 of the second semiconductor layer 213. In some embodiments, fluorine may diffuse into other layers of the light-emitting component 2 other than the current spreading layer 2132, such as the p-type cladding layer 2131. In some embodiments, the fluorine-containing region 2130 has a thickness greater than that of the current spreading layer 2132. In some embodiments, the thickness of the fluorine-containing region 2130 is not greater than that of the current spreading layer 2132. In certain embodiments, the thickness of the fluorine-containing region 2130 ranges from about 1 nm to about 1000 nm. In some other embodiments, the fluorine-containing region 2130 has a thickness smaller than that of the current spreading layer 2132. In some embodiments, the current spreading layer 2132 includes p-doped GaP. The current spreading layer 2132 that includes p-doped GaP has a thickness that ranges from about 5 nm to about 2 µm. The fluorine-containing region 2130 has a fluorine concentration not less than $1E^{17}$ atoms/cm$^3$. In some embodiments, the fluorine-containing region 2130 has a fluorine concentration that ranges from $1E^{17}$ atoms/cm$^3$ to $1E^{21}$ atoms/cm$^3$.

A method for making the second embodiment of the light-emitting component 2 according to the present disclosure is described hereinafter with reference to FIGS. 5 to 11.

Formation of the Light-Emitting Unit 21

Firstly, the light-emitting unit 21 is formed on a growth substrate 20. In detail, the first semiconductor layer 211, the active layer 212, and the second semiconductor layer 213 are sequentially grown on the growth substrate 20.

A metal-organic chemical vapor deposition (MOCVD) epitaxial growth method is used for forming the light-emitting unit 21 on the growth substrate 20. The growth substrate 20 may include, for example, but not limited to, gallium arsenide (GaAs). The first semiconductor layer 211 includes the n-type cladding layer 2111, and the second semiconductor layer 213 includes the p-type cladding layer 2131. The n-type cladding layer 2111 and the p-type cladding layer 2131 may include GaInP, and the active layer 212 may include AlGaInP. In order to facilitate removal of the light-emitting unit 21 from the growth substrate 20 or to ensure the quality of epitaxial growth of the layers of the light-emitting unit 21, a cushioning layer (not shown), a transition layer (not shown), and an etch stop layer (not shown) may be selectively disposed on the growth substrate 20 before epitaxial growth of the light-emitting unit 21. Other configurations of the light-emitting unit 21 may be similar to those described above, and thus the details thereof are omitted for the sake of brevity.

Formation of the Electrically Insulating Layer 22

Secondly, the electrically insulating layer 22 is formed on the second semiconductor layer 213. Since the configurations of the electrically insulating layer 22 have been described above, the details thereof are omitted for the sake of brevity.

The electrically insulating layer 22 is vapor-deposited on the lower surface of the second semiconductor layer distal from the active layer 212. The vapor deposition is performed at a temperature not less than 20° C. In some embodiments, the temperature of the vapor deposition is 200° C. The higher the temperature of the vapor deposition, the higher the density of the fluoride material deposited on the second semiconductor layer 213.

In order to form the through holes 220, before vapor-depositing the electrically insulating layer 22, a plurality of patterned masks (not shown) can be formed on the lower surface of the second semiconductor layer 213. The patterned masks may have a block shape. Each of the patterned masks may be one of a metal layer, an insulating layer, and a combination thereof. After vapor-depositing the electrically insulating layer 22 and removing the patterned masks, the through holes 220 are thus obtained in the electrically insulating layer 22. In the case that each of the patterned masks has a wider surface and a narrower surface which are distal from and proximate to the active layer 212, respectively, each of the through holes 220 thus obtained has an inclined sidewall 223.

Figure 5:
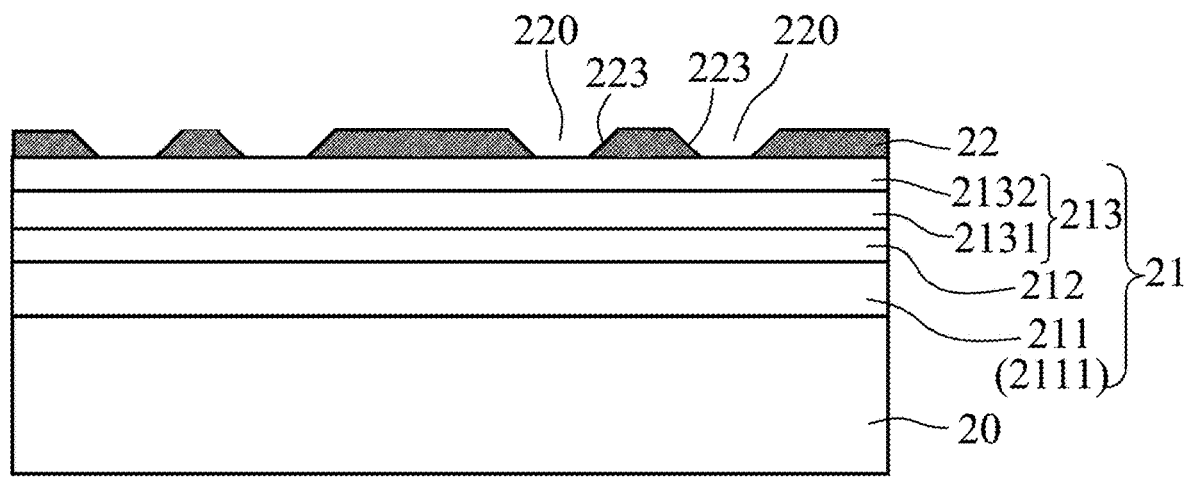
FIGS. 5, 7, and 9 to 11 are schematic views illustrating intermediate states of a method for making the second embodiment of the light-emitting component.
Figure 6:
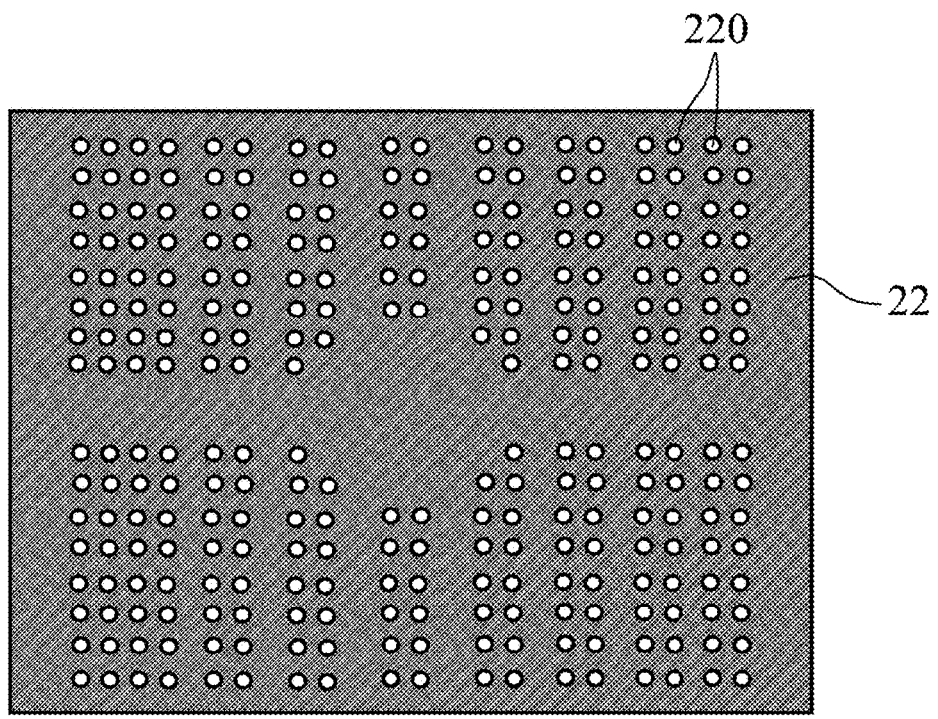
FIG. 6 is a top view of the second embodiment of the light-emitting component shown in FIG. 5.

FIG. 6 is a perspective top view of the structure shown in FIG. 5 which illustrates the through holes 220 of the electrically insulating layer 22. Each of the through holes 220 may have a circular-shaped opening, an oval-shaped opening, or a polygon-shaped opening.

Subjection of the Light-Emitting Unit 21 and the Electrically Insulating Layer 22 to the Heating Treatment Thirdly, the light-emitting unit 21 and the electrically insulating layer 22 are subjected to the heating treatment so as to permit fluoride inside the electrically insulating layer 22 to diffuse into the second semiconductor layer 213, thereby forming the fluorine-containing region 2130 inside the second semiconductor layer 213.

Figure 7:
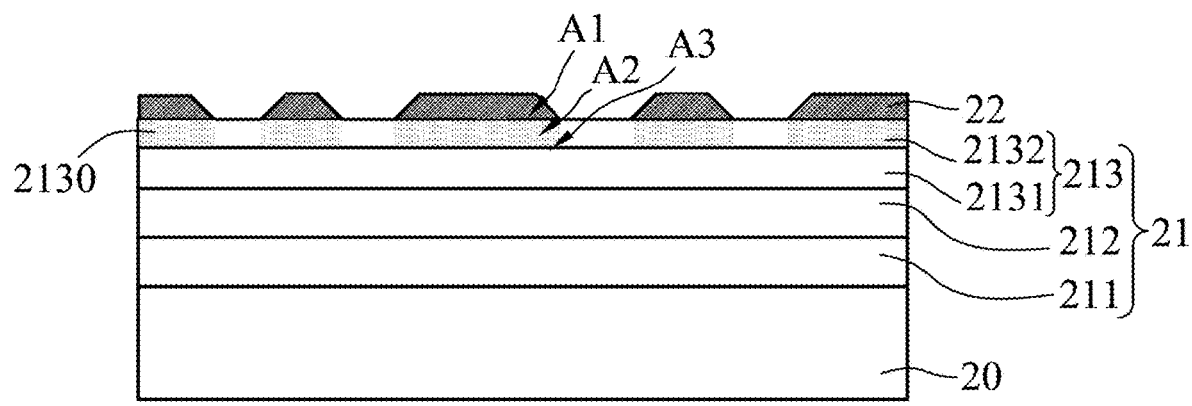

After forming the electrically insulating layer 22, the light-emitting unit 21 and the electrically insulating layer 22 are subjected to the heating treatment. In some embodiments, the heating treatment is performed under inert atmosphere at a temperature ranging from about 460° C. to about 500° C. and for a time period ranging between about 10 minutes and about 30 minutes. Referring to FIG. 7, after the heating treatment, fluorine ions inside the electrically insulating layer 22 diffuses into the current spreading layer 2132 of the second semiconductor layer 213. By controlling the temperature and time period for performing the heating treatment, the distance travelled by the fluorine ions during diffusion into the second semiconductor layer 213 can be different.

Figure 8:
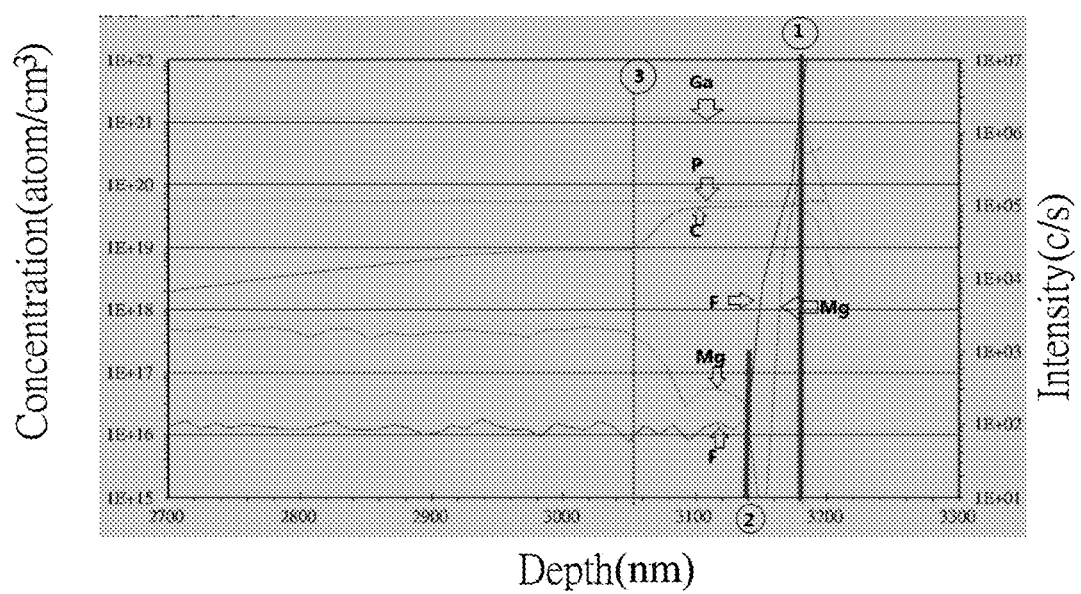
FIG. 8 is a secondary ion mass spectrometry (SIMS) depth profile of the second embodiment of the light-emitting component.

A secondary-ion mass spectrometry (SIMS) was used to regionally analyze the elemental composition (i.e., Ga, P, F, C, and Mg) along the stacking direction of the structure shown in FIG. 7, and FIG. 8 shows the SIMS depth profile. For measuring the SIMS depth profile of the structure shown in FIG. 7, (i) the second semiconductor layer 213 included Ga and P atoms, (ii) the second semiconductor layer 213 included carbon atoms, and (iii) the amounts of Mg and F atoms in the electrically insulating layer 22 were relatively high.

In FIG. 8, the horizontal axis represents a depth from a surface of the growth substrate 20 distal from the active layer 212 along the stacking direction. The vertical lines in FIG. 8 mark different depths along the stacking direction in the structure shown in FIG. 7. The first vertical line (labeled "1") indicates a first depth (A1, see also FIG. 7) at which an interface between the electrically insulating layer 22 (containing fluoride) and the current spreading layer 2132 (including Ga and P atoms) is formed. The second vertical line (labeled "2") indicates a second depth (A2, see also FIG. 7) to which the fluorine inside the electrically insulating layer 22 diffuses. The third vertical line (labeled "3") indicating a third depth (A3, see also FIG. 7) at which an interface between a highly-doped GaP contact layer and a non-highly-doped GaP layer interface (i.e., an interface between the current spreading layer 2132 and the p-type cladding layer 2131) is formed. It is shown in FIG. 8 that the current spreading layer 2132 including Ga and P atoms has a thickness not less than 500 nm, and that fluorine diffuses into the current spreading layer 2132 to a distance not greater than 40 nm.

Through circular transmission line method (CTLM) testing, it can be found that the square resistance of the light-emitting unit 21 increased after the heating treatment. Thus, by diffusing the fluorine into the second semiconductor layer 213, square resistance of the second semiconductor layer 213 increases, which improves uniformity of the dispersion of light.

Formation of the Ohmic Contact Layer 23

Fourthly, the ohmic contact layer 23 is formed on the electrically insulating layer 22.

Figure 9:
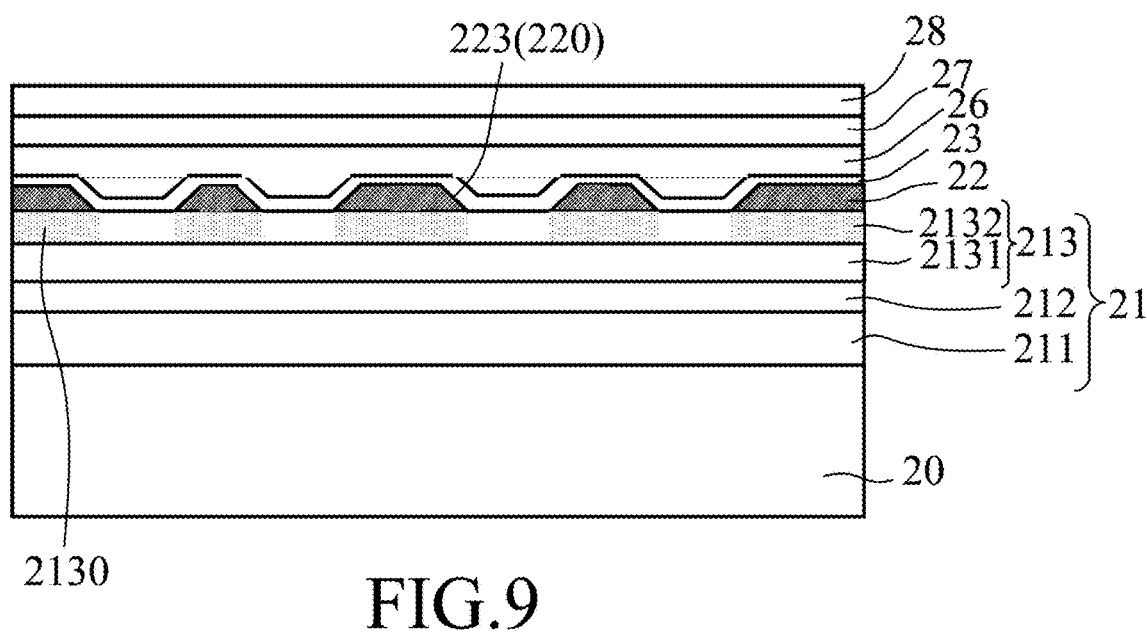

As shown in FIG. 9, the ohmic contact layer 23 including, e.g., ITO or IZO, may be formed by sputtering or vapor deposition. The ohmic contact layer 23 covers the sidewalls 223 of the through holes 220 of the electrically insulating layer 22, the second portion of the second semiconductor layer 213, and the lower surface of the electrically insulating layer 22 (distal from the active layer 212). The ohmic contact layer 23 has a thickness ranging from about 1 nm to about 500 nm.

Formation of the Metallic Reflective Layer 26, the Blocking Layer 27, and the Conductive Bonding Layer 28

As shown in FIG. 9, the metallic reflective layer 26, the blocking layer 27 and the conductive bonding layer 28 may be sequentially formed over the ohmic contact layer 23.

The metallic reflective layer 26 is vapor-deposited or electroplated on the ohmic contact layer 23. In some embodiments, the metallic reflective layer 26 is made of silver.

The blocking layer 27 is vapor-deposited to prevent silver in the metallic reflective layer 26 from diffusing into the conductive bonding layer 28. The blocking layer 27 includes at least one of titanium, platinum, chromium, or the like.

The conductive bonding layer 28 is formed by vapor deposition and may include materials such as gold, indium, tin, or the like.

Bonding of the Substrate 29 and Removal of the Growth Substrate 20

Figure 10:
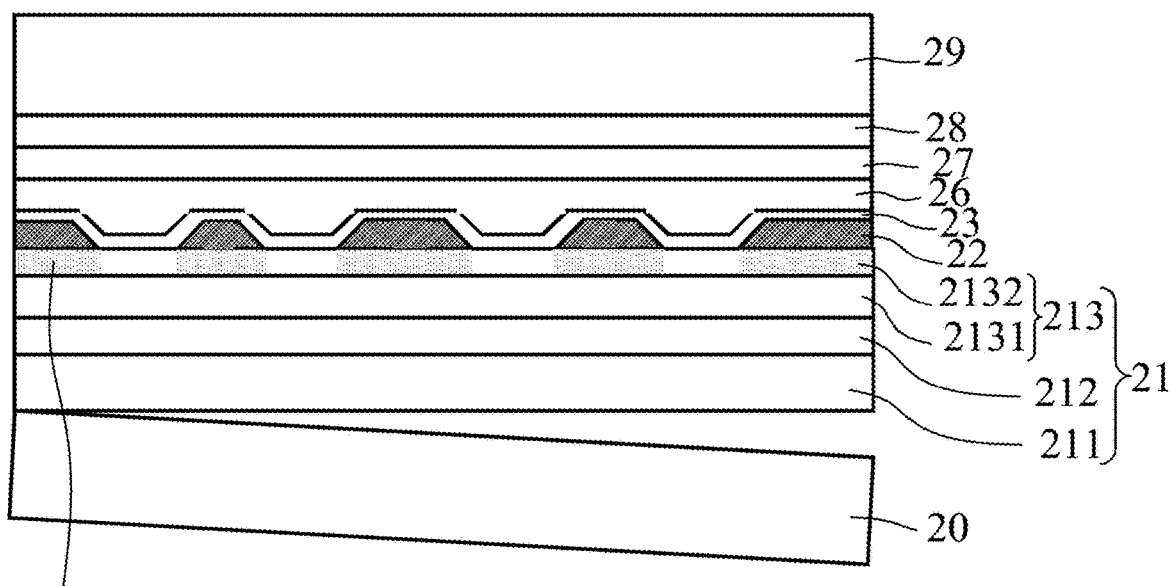

Next, as shown in FIG. 10, the substrate 29 is bonded to the blocking layer 27 through the conductive bonding layer 28. The bonding process is performed at a high temperature and is similar to the process of bonding two metals (e.g., Au and In) at a temperature of about 220° C. In some embodiments, the substrate 29 is a silicon substrate. The growth substrate 20 is then removed. The growth substrate 20 may be removed by grinding or wet etching.

Formation of the First Electrode 24 and the Second Electrode 25

Figure 11:
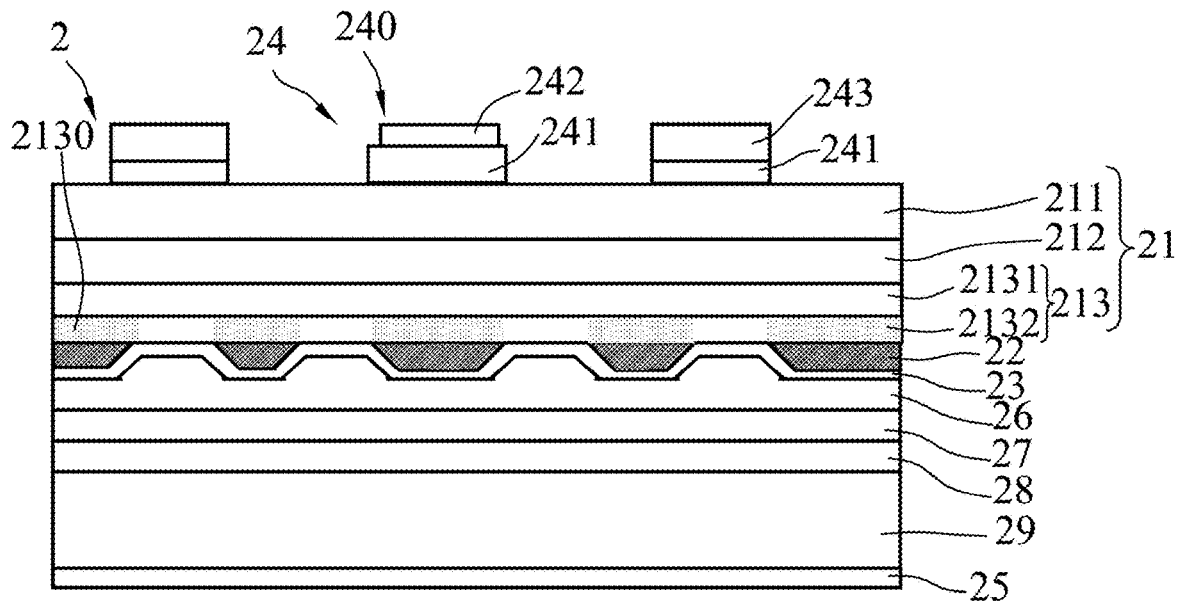

Thereafter, the first electrode 24 is disposed on the upper surface of the first semiconductor layer 211, and the lower metallic layer 25 is formed on the substrate 29 as the second electrode 25. The first electrode 24 is electrically connected to the first semiconductor layer 211, and the second electrode 25 is electrically connected to the second semiconductor layer 213. In some embodiments, as illustrated in FIG. 11, the extension electrode 243 extending from the main pad electrode 240 may be spaced apart from the wiring connection layer 242. A portion of the lower contact layer 241 including gallium arsenide is retained beneath the extension electrode 243 of the first electrode 24, and a remaining portion of the lower contact layer 241 is etched away. The lower metallic layer 25 may be made of materials such as gold or platinum. A light-emitting component 2 can thus be obtained.

The light-emitting component 2 can be further etched to form a roughened surface or pattern to facilitate light emission.

Separation

The light-emitting component 2 is then separated into a plurality of light-emitting elements by a separation process, the light-emitting elements being covered by an insulating protective layer.

Figure 12:
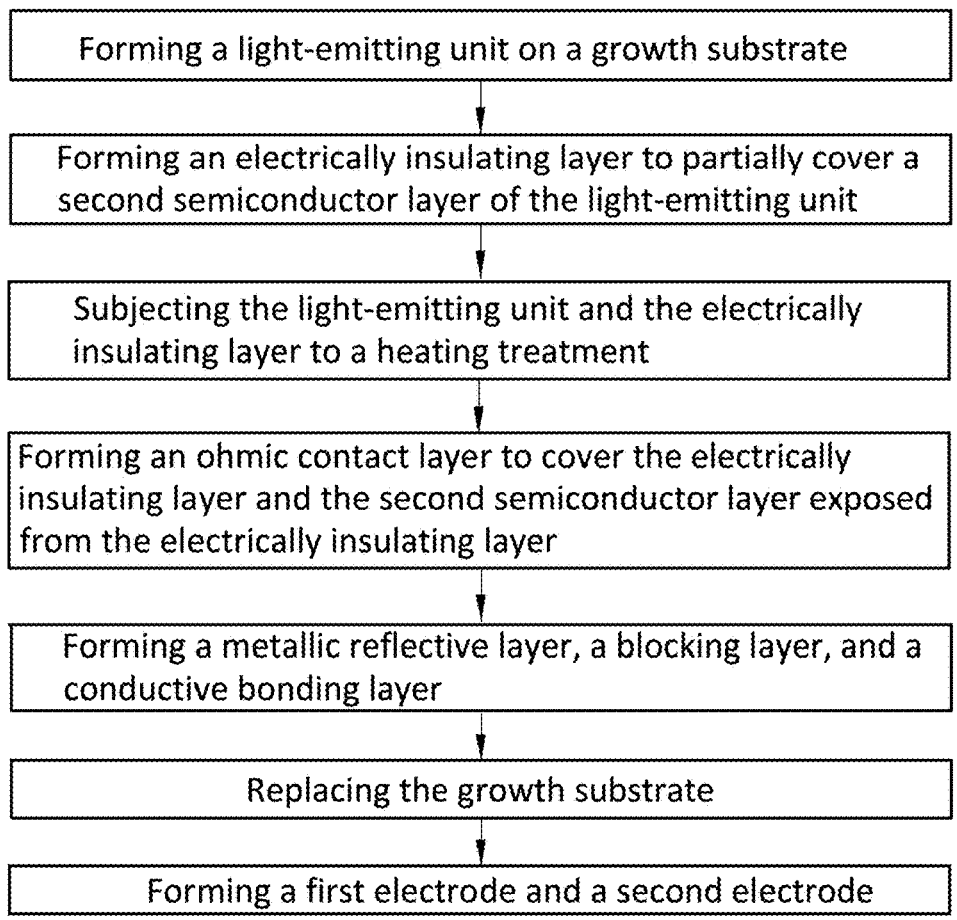
FIG. 12 is a schematic flow chart illustrating the method for making the second embodiment of the light-emitting component.

Referring to FIG. 12, a flow chart of the method for making the second embodiment of the light-emitting component 2 according to this disclosure is provided.

Figure 13:
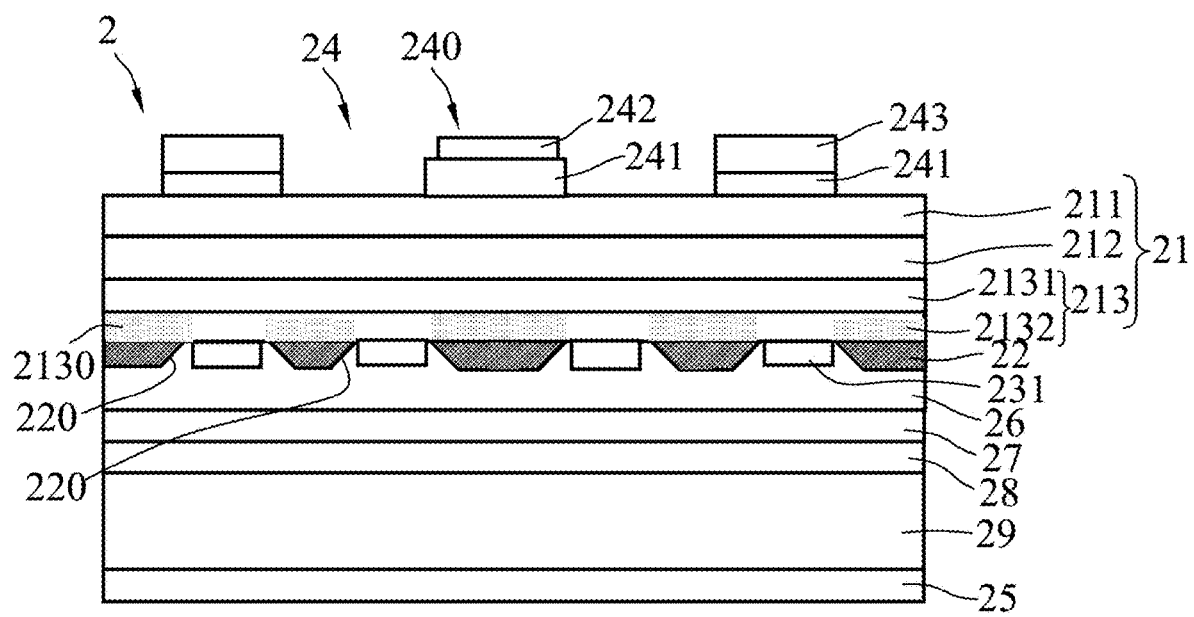
FIG. 13 is a schematic view illustrating a third embodiment of the light-emitting component according to the present disclosure.
Figure 14:
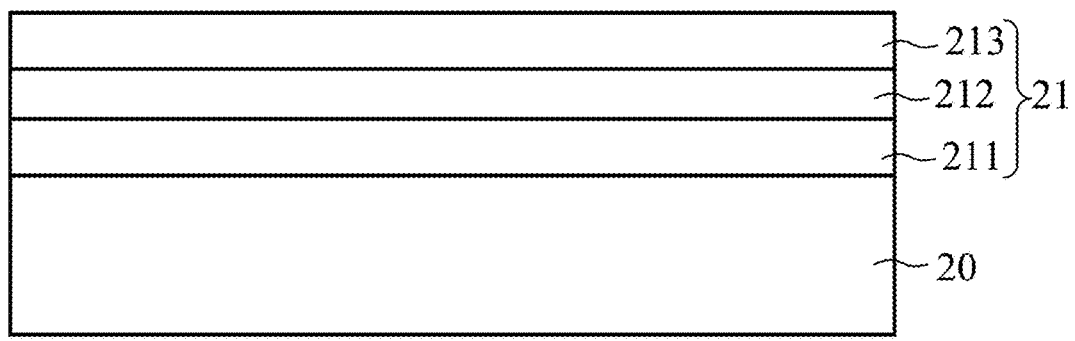
FIGS. 14 to 20 are schematic views illustrating intermediate states of a method for making the third embodiment of the light-emitting component.

FIG. 13 illustrates a third embodiment of the light-emitting component 2 according to the present disclosure. The third embodiment is similar to the second embodiment, except that in the third embodiment, the ohmic contact layer 23 is a patterned layer including a plurality of metal regions (i.e., ohmic contact blocks 231). In some embodiments, each of the ohmic contact blocks 231 includes at least two different metals.

In this embodiment, the ohmic contact blocks 231 at least partially fills the through holes 220 of the electrically insulating layer 22. The ohmic contact blocks 231 are arranged to stagger from the main pad electrode 240 in the stacking direction. The main pad electrode 240 of the first electrode 24 and the second electrode 25 are provided to permit a current from an external source to flow through the light-emitting unit 21. Each of the ohmic contact blocks 231 has a block shape, and may include at least one of gold germanium, gold germanium nickel, gold zinc, gold beryllium, or the like. Each of the ohmic contact blocks 231 has a width in a direction transverse to the stacking direction, and has a thickness in the stacking direction. The width of each ohmic contact block 231 ranges from about 1 μm to about 10 μm, and the thickness of each ohmic contact block 231 ranges from about 1 nm to about 500 nm.

In some embodiments, as illustrated in FIG. 13, the metallic reflective layer 26 covers and is in contact with the ohmic contact blocks 231 and a portion of the electrically insulating layer 22.

In some embodiments, as illustrated in FIG. 13, the fluorine ions diffuse at most to a distance in the current spreading layer 2132 (i.e., the p-doped GaP layer) of the second semiconductor layer 213 in the stacking direction such that the diffusion distance equals the thickness of the current spreading layer 2132 in the stacking direction.

A method for making the structure of the third embodiment of the light-emitting component 2 is disclosed hereinafter with reference to FIGS. 14 to 20.

Formation of the Light-Emitting Unit 21 on the Growth Substrate 20

This step is performed in the same way as that described in the method for making the second embodiment of the light-emitting component 2. Since the possible materials and/or possible configurations for the light-emitting unit 21 and the growth substrate 20 are similar to those described above, the details thereof are omitted for the sake of brevity.

In this embodiment, all of the first semiconductor layer 211, the second semiconductor layer 213, and the active layer 212 are made from aluminum gallium indium phosphorus-based semiconductors. In some embodiments, the first semiconductor layer 211 may further include an n-type gallium arsenide layer as an ohmic contact layer for forming ohmic contact of the first electrode 24 formed in a subsequent step. In some embodiments, the second semiconductor layer 213 may include a p-type current spreading layer (e.g., a p-type gallium phosphide layer), which is used for forming ohmic contact of the second electrode 25 formed in a subsequent step.

Formation of the Ohmic Contact Blocks 231

An ohmic contact layer 230 (see FIG. 15) is vapor-deposited on the surface of the second semiconductor layer 213 distal from the active layer 212. A silicon-based layer 31 (e.g., a silicon oxide layer or a silicon nitride layer) is formed on a surface of the ohmic contact layer 230 distal from the light-emitting unit 21 by chemical vapor deposition (CVD). Then, a patterned photoresist layer 32 is formed on the silicon-based layer 31. In some embodiments, the ohmic contact layer 230 includes gold zinc.

Figure 15:
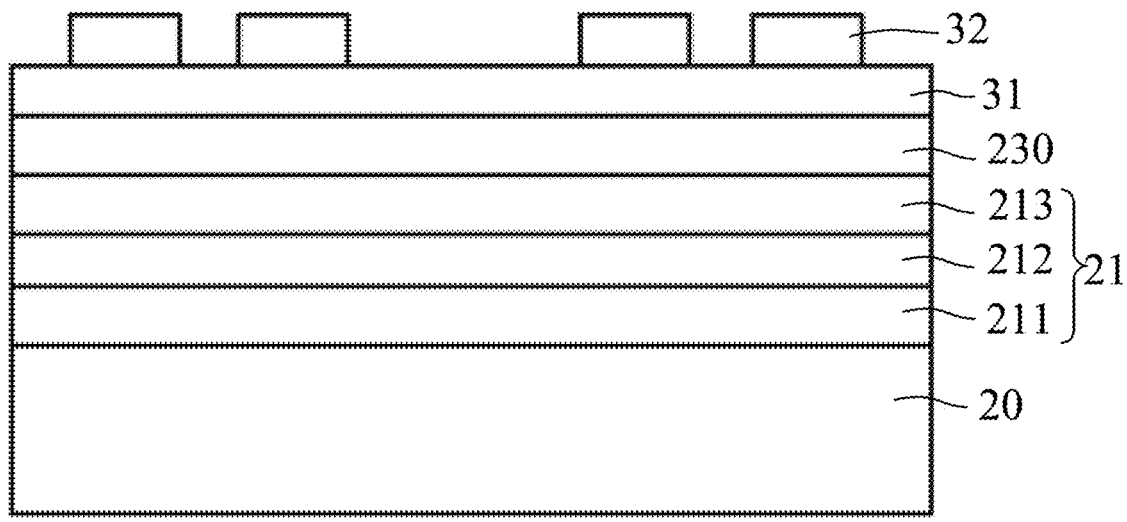
Figure 16:
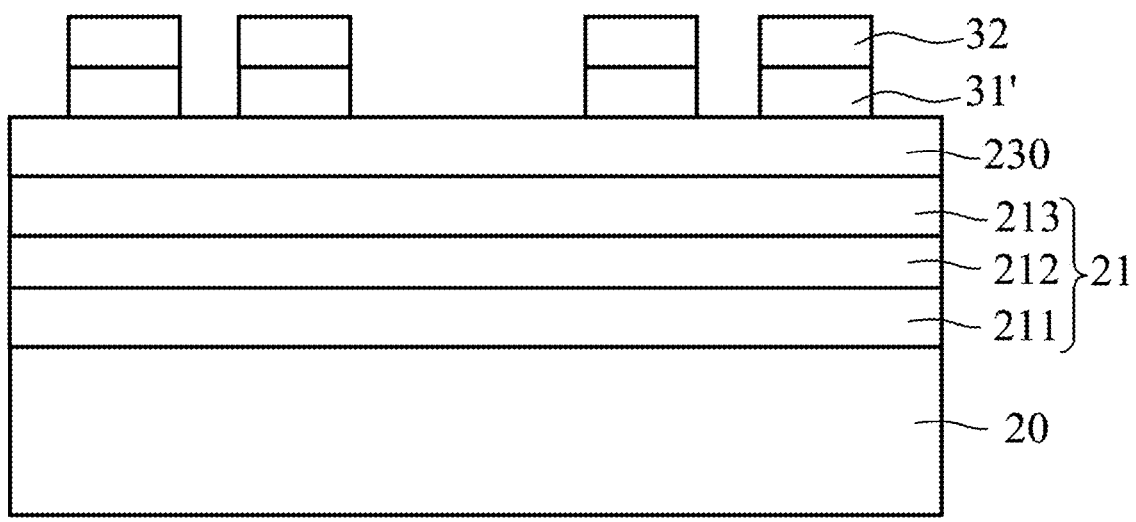
Figure 17:
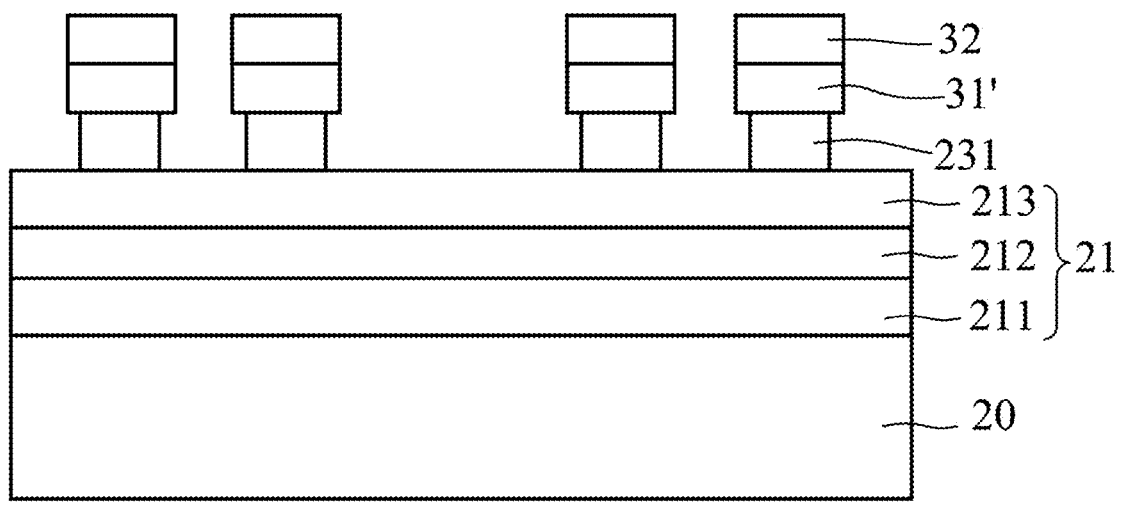

As shown in FIG. 16, using the patterned photoresist layer 32 as a mask, the silicon-based layer 31 shown in FIG. 15 is buffered oxide etched (BOE) to form a plurality of silicon-based blocks 31'.

Afterwards, an etching solution is used to selectively etch the ohmic contact layer 230, and the etching time is controlled so that a residual ohmic contact layer 231 (see FIG. 17) can remain between the silicon-based blocks 31' and the second semiconductor layer 213. The residual ohmic contact layer 231 serves as the ohmic contact blocks 231. Each of the ohmic contact blocks 231 has a width which is in a direction transverse to the stacking direction and which is less than a width of the silicon-based blocks 31' by at least 2 µm. Thereafter, the patterned photoresist layer 32 is removed. The ohmic contact blocks 231 are then subjected to a heating treatment in order to be fusion bonded with the second semiconductor layer 213 and to form an ohmic contact between the ohmic contact blocks 231 and the second semiconductor layer 213.

Vapor Deposition of the Electrically Insulating Layer 22

Figure 18:
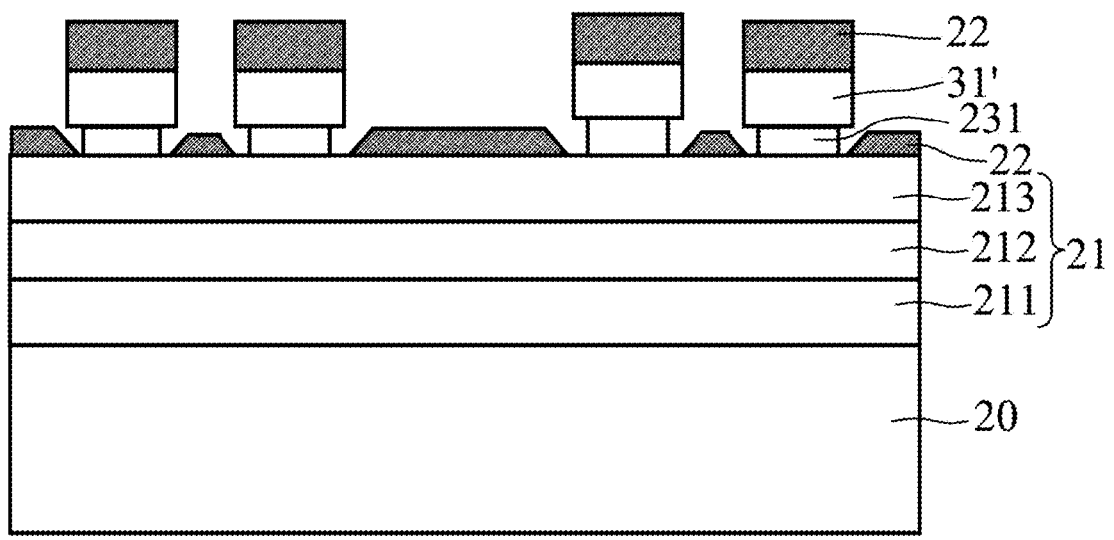

The ohmic contact blocks 231 and the silicon-based blocks 31' are combined to form a mask having wide-top narrow-bottom patterns as illustrated FIG. 18, and the electrically insulating layer 22 including fluoride is then vapor-deposited on the silicon-based blocks 31' and the second semiconductor layer 213. The thickness of the electrically insulating layer 22 ranges from about 50 nm to about 500 nm. In some embodiments, the thickness of the electrically insulating layer 22 ranges from about 50 nm to about 150 nm. In certain embodiments, the thickness of the electrically insulating layer 22 is about 100 nm.

Figure 19:
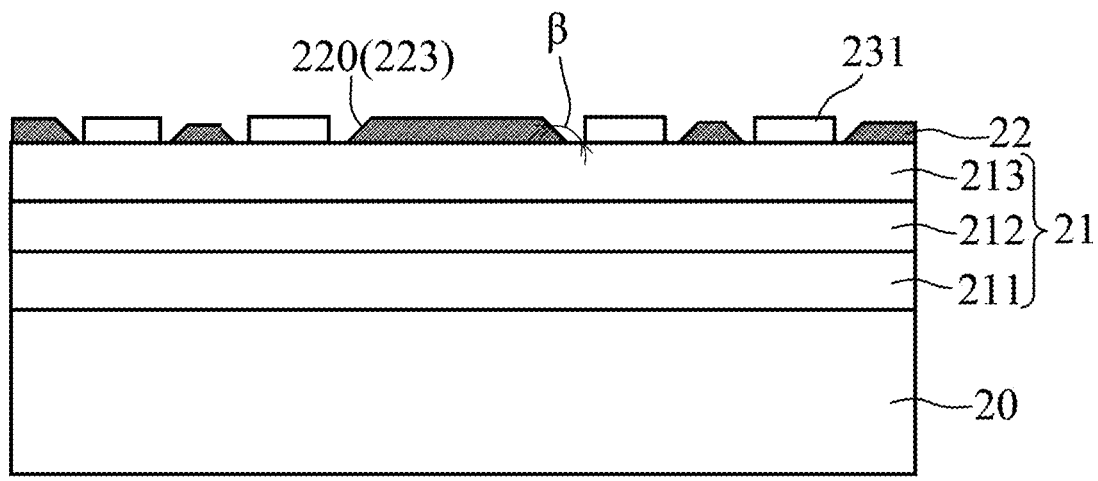

As shown in FIG. 19, the silicon-based blocks 31' shown in FIG. 18 are removed, and the electrically insulating layer 22 deposited on the silicon-based blocks 31' is also removed accordingly. The removal of the silicon-based blocks 31' may be performed using BOE. The ohmic contact blocks 231 and the electrically insulating layer 22 deposited on the second semiconductor layer 213 are left in contact with the second semiconductor layer 213. The electrically insulating layer 22 has a plurality of through holes 220, and the ohmic contact blocks 231 is located in the through holes 220. In this embodiment, each of the ohmic contact blocks 231 has a contact surface in contact with the lower surface of the second semiconductor layer 213, a distal surface opposite to the contact surface, and a side surface connecting the contact surface and the distal surface. In this embodiment, the sidewall 223 of each of the through holes 220 inclines relative to the side surface of a corresponding one of the ohmic contact blocks 231, and defines an obtuse angle (θ) together with the surface of the second semiconductor layer 213 distal from the active layer 212.

Subjection of the Electrically Insulating Layer 22, the Ohmic Contact Blocks 231, the Light-Emitting Unit 21, and the Growth Substrate 20 to Heating Treatment After the electrically insulating layer 22 is formed, the growth substrate 20, the light-emitting unit 21, the ohmic contact blocks 231, the electrically insulating layer 22, and the ohmic contact blocks 231 are subjected to a heating treatment. In this embodiment, the heating treatment is performed under inert gas atmosphere at a temperature ranging between about 460° C. and about 500° C. and for a time period ranging between about 10 minutes and about 30 minutes. It should be noted that by controlling the temperature and time period of the heating treatment, a distance to which fluorine inside the electrically insulating layer 22 diffuses into the second semiconductor layer 213 can be adjusted.

Figure 20:
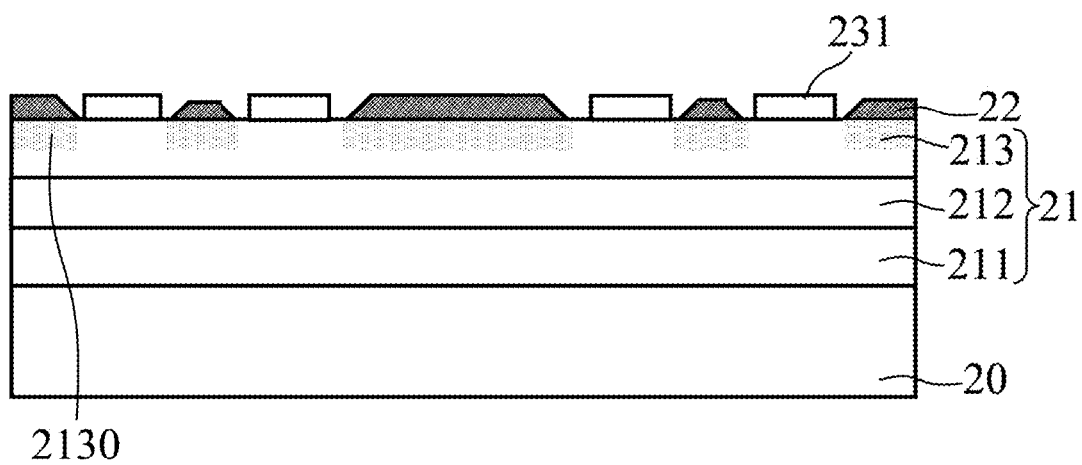

As shown in FIG. 20, the heating treatment allows the fluorine ions in the electrically insulating layer 22 to diffuse into the second semiconductor layer 213.

Figure 21:
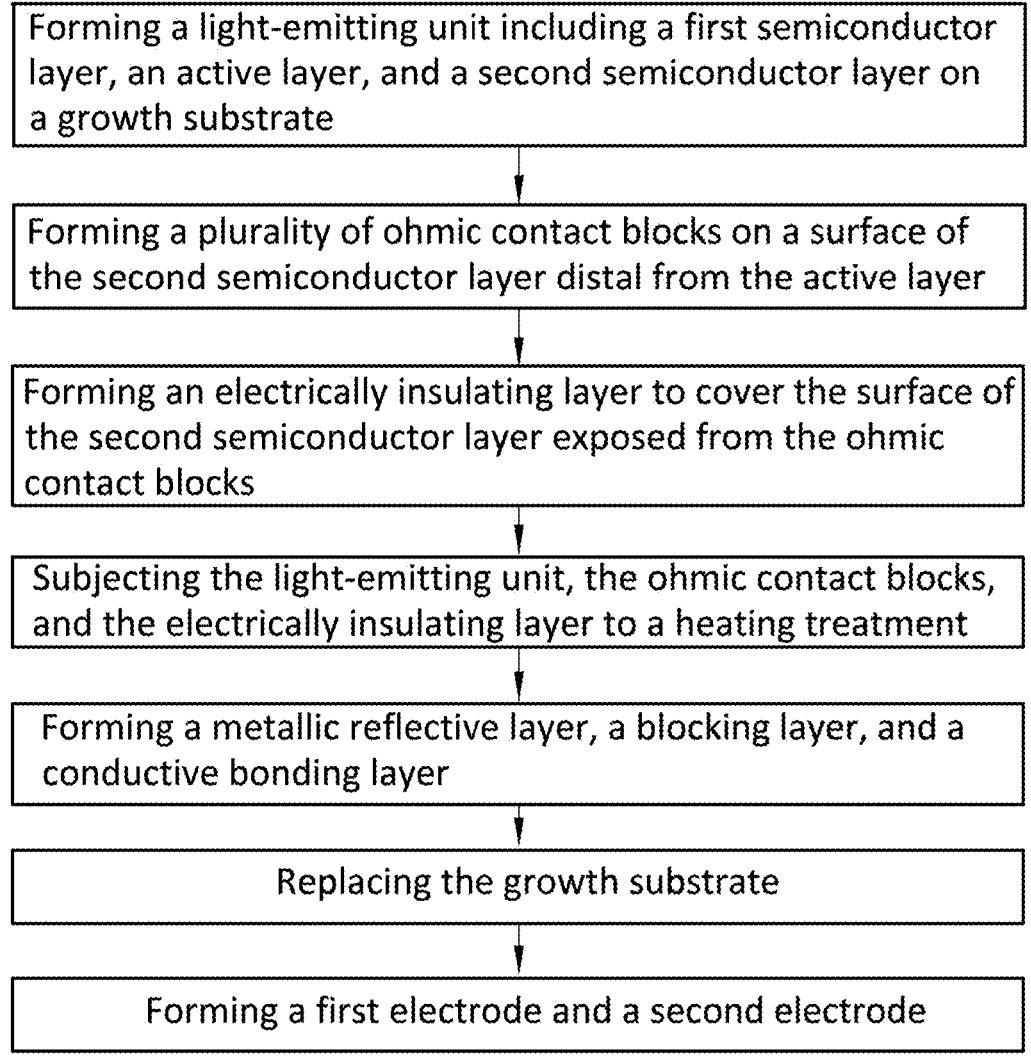
FIG. 21 is a schematic flow chart illustrating the method for making the third embodiment of the light-emitting component.

The steps of forming the metallic reflective layer 26, the blocking layer 27 and the conductive bonding layer 28, bonding the substrate 29, removing the growth substrate 20, forming the first electrode 24 and the lower metallic layer 25, and obtaining the light-emitting component 2 can be performed with reference to the corresponding steps in the abovementioned embodiment (i.e., the second embodiment). The thus obtained light-emitting component 2 is shown in FIG. 13. Referring to FIG. 21, a flow chart of the method for making the third embodiment of the light-emitting component 2 is provided.

In some embodiments, fusion bonding of the ohmic contact blocks 231 and the second semiconductor layer 213 and performing the heating treatment after formation of the electrically insulating layer 22 can be the performed simultaneously.

Figure 22:
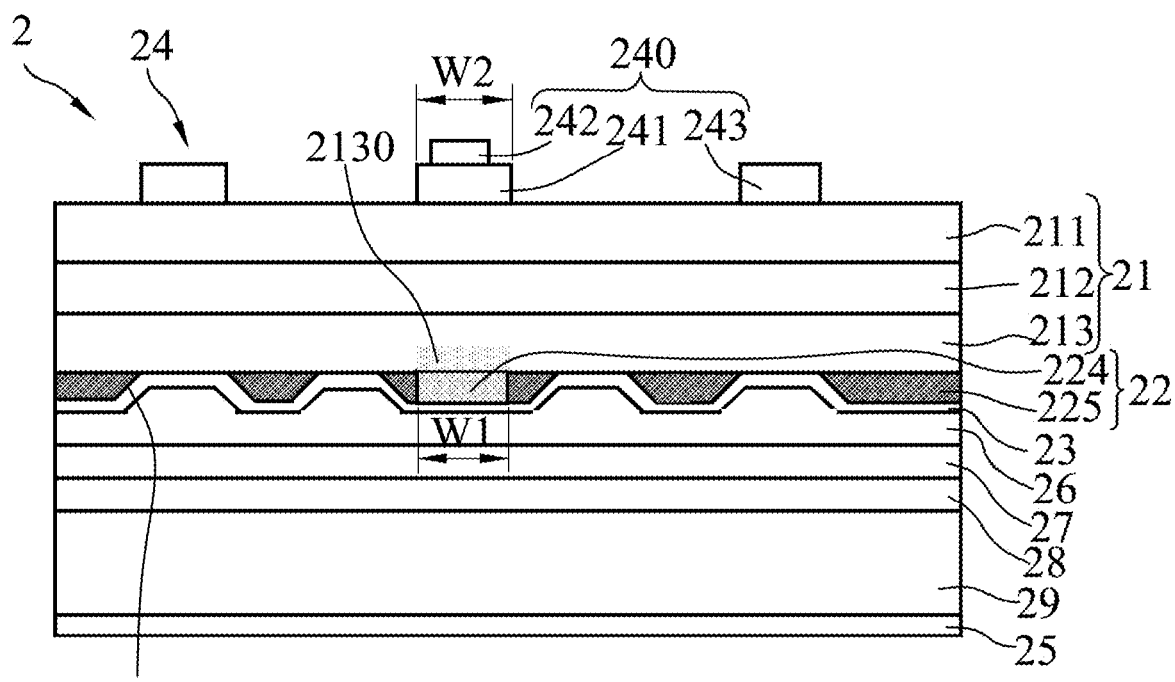
FIG. 22 is a schematic view illustrating a fourth embodiment of the light-emitting component according to the present disclosure.

As shown in FIG. 22, a fourth embodiment of the light-emitting component 2 according to the present disclosure is disclosed. The fourth embodiment of the light-emitting component 2 is similar to the second embodiment except the distribution of the fluorine-containing region 2130 in the light-emitting component 2.

The ohmic contact layer 23 of this embodiment may be replaced with the ohmic contact blocks 231 disclosed in the third embodiment of the light-emitting component 2 of the present disclosure.

In this embodiment, the electrically insulating layer 22 in alignment with the extension electrode 243 in the stacking direction exhibits no fluorine diffusion.

The fluorine-containing region 2130 is used mainly to change the current transmission route from the second electrode 25 to the first electrode 24 so as to prevent the current from accumulating and transmitting in alignment with the main pad electrode 240 in the stacking direction, thereby forcing the current to flow in the second semiconductor layer 213 thoroughly to reach a distance as far as possible while limiting current flow to the first electrode 24 only through the through holes 220 of the electrically insulating layer 22.

As shown in FIG. 22, the electrically insulating layer 22 includes a first part 224 and a second part 225. The first part 224 is mainly located in alignment with the main pad electrode 240 of the first electrode 24 in the stacking direction. A ratio of a surface area of the light-emitting unit 21 in contact with the first part 224 to a surface area of the light-emitting unit 21 in contact with the main pad electrode 240 ranges from about 1 to about 1.5. In some embodiments, the ratio is not greater than about 1.2. In certain embodiments, the ratio is not greater than about 1.1.

In some embodiments, a ratio of a width (W1) of the first part 224 to a width (W2) of the main pad electrode 240 ranges from about 1 to about 1.25. In some embodiments, the ratio is not greater than about 1.2. In certain embodiments, the ratio is not greater than about 1.1.

In this embodiment, the second part 225 of the electrically insulating layer 22 is staggered from the main pad electrode 240 of the first electrode 24 in the stacking direction, and the through holes 220 of the electrically insulating layer 22 are formed in the second part 225.

The structure of the fourth embodiment of the light-emitting component 2 can effectively increase voltage stability of the light-emitting component 2.

In order to obtain the fourth embodiment of the light-emitting component 2, a method for making the fourth embodiment of the light-emitting component 2 is disclosed hereinafter.

Figure 23:
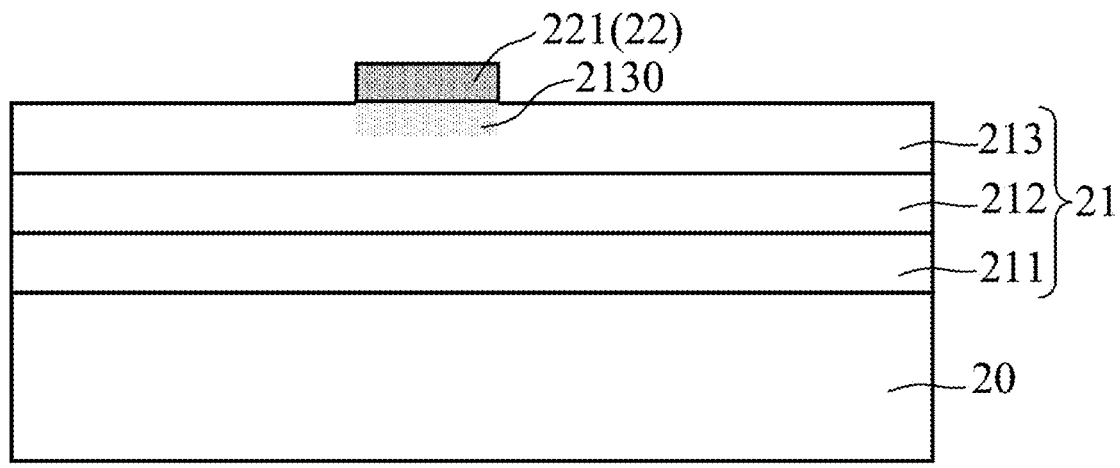
FIGS. 23 and 25 are intermediate states of a method for making the fourth embodiment of the light-emitting component.

Firstly, as shown in FIG. 23, the light-emitting unit 21 is formed on the growth substrate 20 in a manner similar to that disclosed in the second embodiment.

Figure 24:
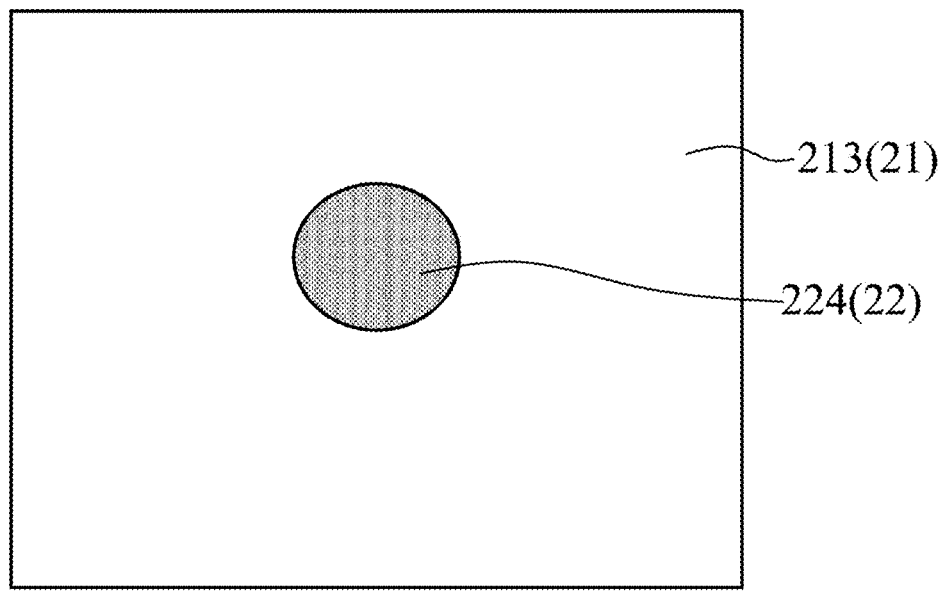
FIG. 24 is a top view of the fourth embodiment of the light-emitting component shown in FIG. 23.

Secondly, as shown in FIGS. 23 and 24, the first part 224 of the electrically insulating layer 22 is vapor-deposited on the second semiconductor layer 213 at a relatively high temperature so as to permit fluorine inside the first part 224 to diffuse into the second semiconductor layer 213, to thereby form the fluorine-containing region 2130 in the second semiconductor layer 213. FIG. 24 is a top view of the structure shown in FIG. 23, which illustrates the position of the first part 224 disposed on the second semiconductor layer 213.

Figure 25:
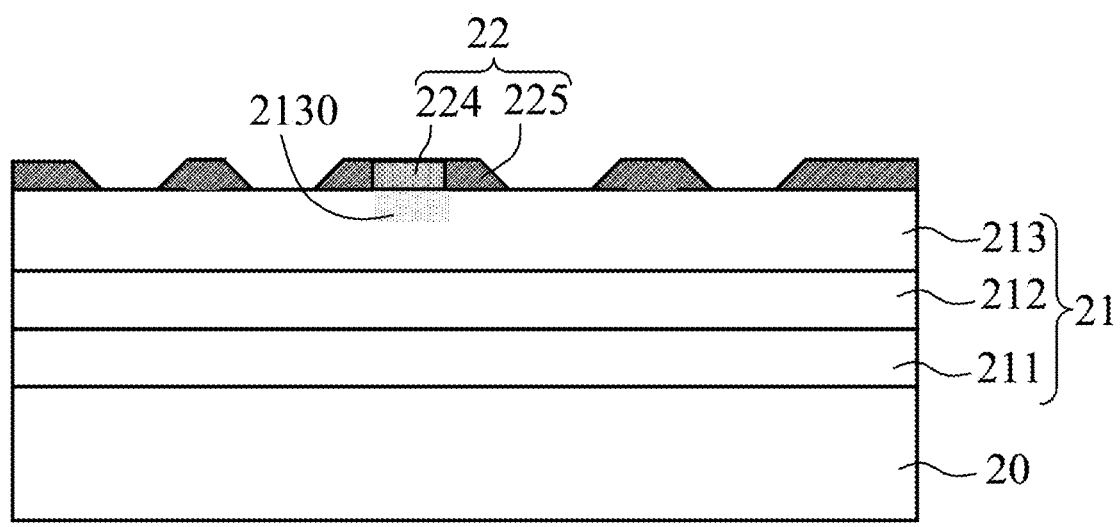
Figure 26:
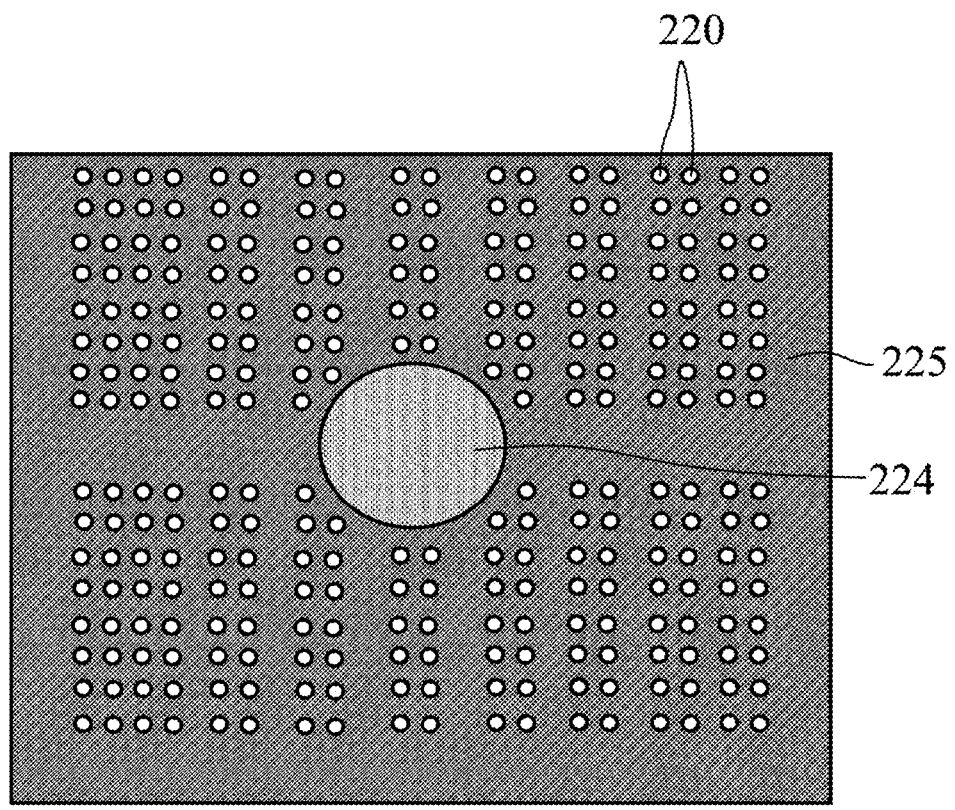
FIG. 26 is a top view of the fourth embodiment of the light-emitting component shown in FIG. 25.

Thereafter, as shown in FIGS. 25 and 26, the second part 225 of the electrically insulating layer 22 is vapor-deposited on a remaining part of the first portion of the second semiconductor layer 213 to expose the second portion of the second semiconductor layer 213 through the through holes 220. Then, the ohmic contact layer 23 is formed to cover the electrically insulating layer 22 and the sidewalls 223 of the through holes 220 (see also FIG. 22).

Figure 27:
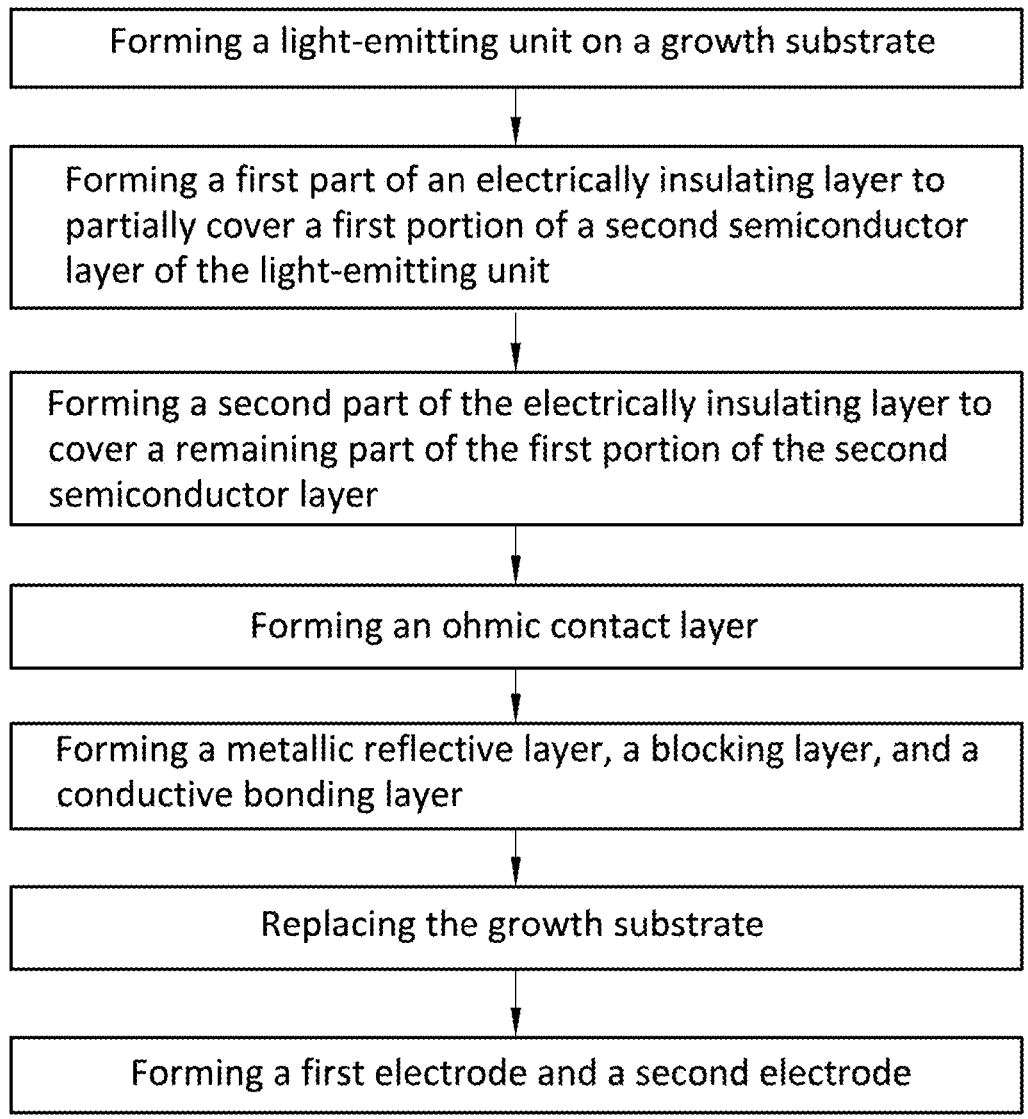
FIG. 27 is a schematic flow chart illustrating the method for making the fourth embodiment of the light-emitting component.

The remaining steps of the method for making the fourth embodiment of the light-emitting component 2 are shown in the flow chart of FIG. 27, and can be performed by referring to the corresponding steps in the second and third embodiments so as to obtain the fourth embodiment of the light-emitting component 2 shown in FIG. 22. In this embodiment, the main pad electrode 240 of the first electrode 24 is in alignment with the first part 224 of the electrically insulating layer 22 in the stacking direction (see FIG. 22).

Figure 28:
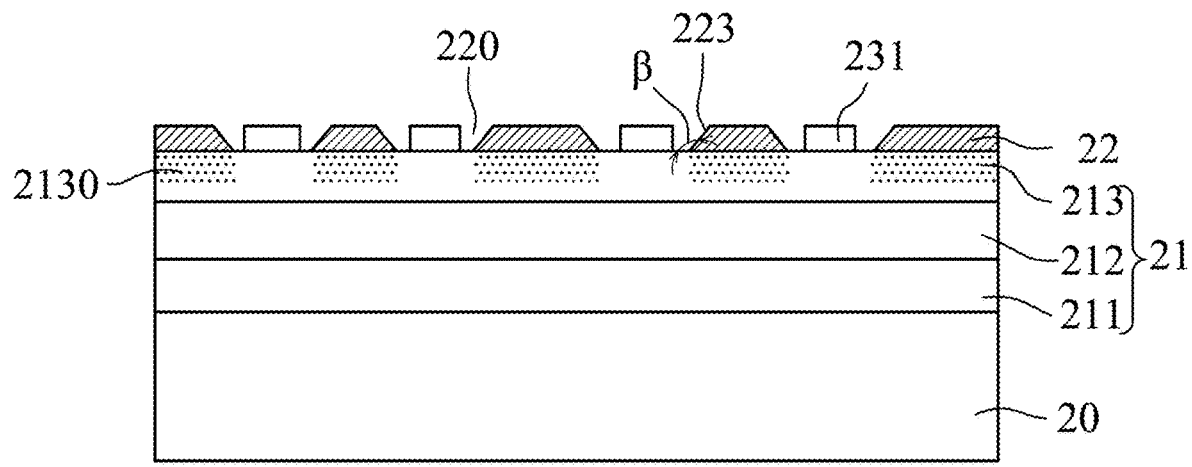
FIG. 28 is a schematic view illustrating a fifth embodiment of the light-emitting component according to the present disclosure.
Figure 29:
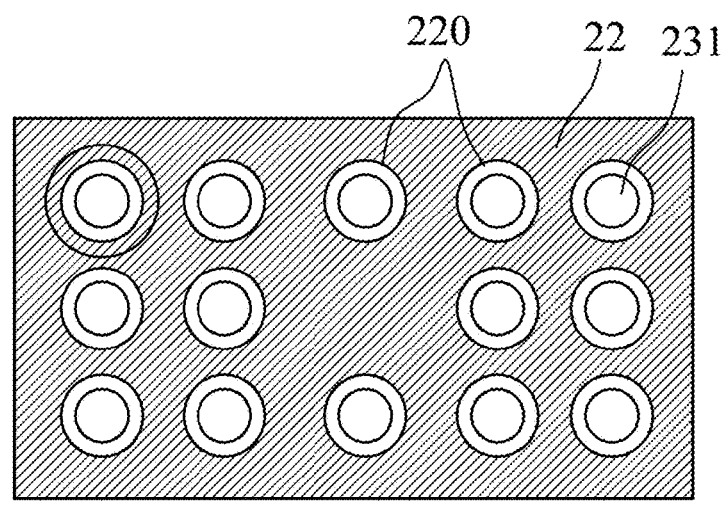
FIG. 29 is a top view of the fifth embodiment of the light-emitting component shown in FIG. 28.
Figure 30:
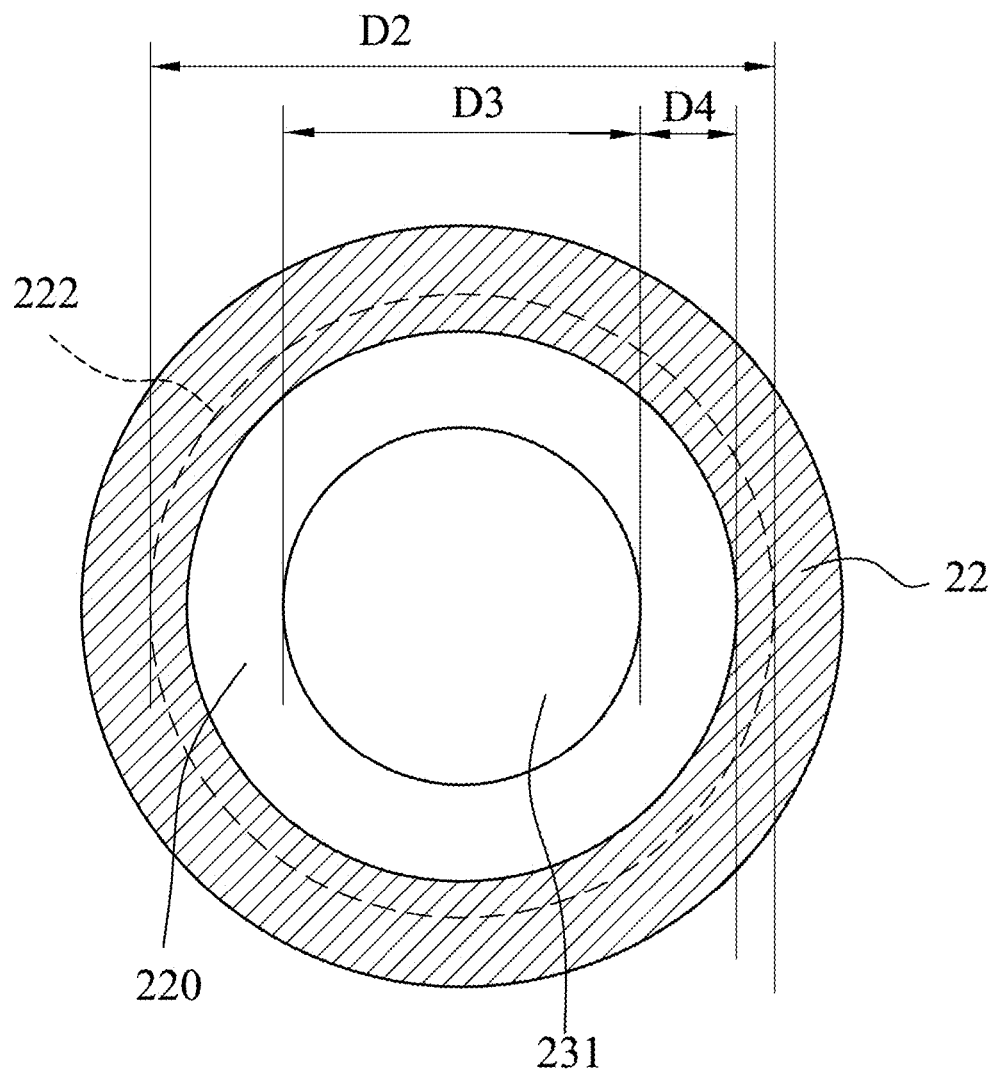
FIG. 30 is an enlarged view of a through hole of the fifth embodiment of the light-emitting component shown in FIG. 29.

FIGS. 28 to 30 illustrates a fifth embodiment of the light-emitting component 2 according to the present disclosure. The fifth embodiment of the light-emitting component 2 is similar to the third embodiment, except that, in the fifth embodiment of the light-emitting component 2, the structural relationship between the electrically insulating layer 22 and the ohmic contact blocks 231 are further specified.

Similar to FIG. 20, the sidewall 223 of each of the through holes 220 shown in FIG. 28 inclines relative to the side surface of a corresponding one of the ohmic contact blocks 231, and defines an obtuse angle (13) together with the surface of the second semiconductor layer 213 distal from the active layer 212, which is beneficial for subsequently forming a smooth metallic reflective layer 26. In this embodiment, the obtuse angle (S) ranges between about 110° and about 170°. FIG. 29 is a top view of the structure shown in FIG. 23, which illustrates the structural relationship between the through holes 220 formed in the electrically insulating layer 22 and the ohmic contact blocks 231. FIG. 30 is a partially enlarged view of FIG. 29 illustrating the structural relationship between one of the through holes 220 and one of the ohmic contact blocks 231.

Referring to FIG. 30, each of the ohmic contact blocks 231 has a horizontal width (D3) in a direction transverse to the stacking direction. The horizontal width (D3) ranges between about 1 μm and about 10 μm. In some embodiments, the horizontal width (D3) ranges from about 2 μm to about 7 μm. In this embodiment, the horizontal width (D3) is about 5 μm. The second size (D2) of each of the second openings 222 of each of the through holes 220 of the electrically insulating layer 22 is controlled to be greater than the horizontal width (D3) by at least about 0.5 μm. In this embodiment, the second size (D2) is about 2 μm. The ohmic contact blocks 231 are respectively disposed in the through holes 220, and the size difference between two adjacent ones of the ohmic contact blocks 231 does not exceed ±10%.

Referring to FIG. 30, a distance (D4) between the first opening 221 of each of the through holes 220 and the side surface of a corresponding one of the ohmic contact blocks 231 disposed in the through hole 220 is present so that a part of the second semiconductor layer 213 is exposed from the through hole 220. Generally, the distance (D4) ranges from 0 μm to about 1 μm. The exposed part of the second semiconductor layer 213 is small and is directly contacted by the metallic reflective layer 26, and thus, it does not have a significant impact on the photoelectric performance of the light-emitting component 2.

The through holes 220 usually have a cross-sectional shape that is designed according to the shape of the ohmic contact blocks 231. The cross-sectional shape of each of the through holes 220 is usually made into, for example, a circular shape, an elliptical shape, a square shape, or a polygonal shape.

By encapsulating the light-emitting components 2 on a supporting component such as an epoxy molding compound (EMC) lead frame or a ceramic support, a packaging structure (a light-emitting device) can be obtained. The light-emitting device may further include a driving circuit for driving the light-emitting components 2. In addition, according to application requirements, optical components such as light guide plates, prismatic lens, light diffusing sheets, and fluorescent sheets may be disposed in the path of the light emitted from the light-emitting component 2. Further applications of the light-emitting device can include displays such as TVs or display screens, lighting devices such as indoor lights, street lights, indicators, etc.

The embodiments of the present disclosure have the following advantages. The fluorine-containing region of the present disclosure is formed at least in the second semiconductor layer disposed in alignment with the main pad electrode of the first electrode in the stacking direction, which increases the local square resistance and improves current spread in the second semiconductor layer disposed in alignment with the main pad electrode, thereby promoting lateral diffusion of the current away from the main pad electrode and into surrounding regions of the main pad electrode. Thus, light emission under the first electrode is reduced, that is, electrode shading is decreased and uniform dispersion of light is improved.

Additionally, the fluorine-containing region is formed directly from the electrically insulating layer (i.e., diffusion of fluorine inside the electrically insulating layer into the second semiconductor layer) under the heating treatment, which is a relatively simple and highly feasible process.

Moreover, the fluorine-containing region is disposed at least in alignment with the main pad electrode in the stacking direction, and can be formed in the current spreading layer of the second semiconductor layer, which effectively guide current flow in the current spreading layer and changes the current transmission route.

Furthermore, the fluorine-containing region may be disposed in alignment with or near the main pad electrode of the first electrode in the stacking direction. This prevents the current paths from being concentrated under the main pad electrode, force lateral diffusion of the current to surrounding regions of the main pad electrode, and prevents voltage of the light-emitting component from being raised too high.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting component, comprising:
    a light-emitting unit including a first semiconductor layer, an active layer, and a second semiconductor layer, which are stacked on one another along a stacking direction in such order, said first semiconductor layer having a conductivity type different from that of said second semiconductor layer, said second semiconductor layer having a lower surface distal from said active layer; and
    an electrically insulating layer disposed to cover a first portion of said lower surface of said second semiconductor layer and to expose a second portion of said lower surface of said second semiconductor layer such that an electric current is permitted to flow outwardly from said lower surface of said second semiconductor layer through said second portion,
    wherein a fluorine-containing region is formed in said second semiconductor layer.

2. The light-emitting component as claimed in claim 1, wherein said fluorine-containing region is formed in a position corresponding to said first portion of said lower surface of said second semiconductor layer, and is in contact with said electrically insulating layer.

3. The light-emitting component as claimed in claim 1, wherein said electrically insulating layer includes a fluoride material.

4. The light-emitting component as claimed in claim 1, wherein said fluorine-containing region is formed by diffusion of fluorine inside said electrically insulating layer into said second semiconductor layer.

5. The light-emitting component as claimed in claim 4, wherein said fluorine-containing region of said second semiconductor layer has a thickness that ranges from 1 nm to 1000 nm.

6. The light-emitting component as claimed in claim 1, wherein said fluorine-containing region has a fluorine concentration that ranges from $1E^{17}$ atoms/cm$^3$ to $1E^{21}$ atoms/cm$^3$.

7. The light-emitting component as claimed in claim 1, wherein said second semiconductor layer includes a current spreading layer which has said lower surface, said fluorine-containing region being formed to extend from said first portion of said lower surface into said current spreading layer.

8. The light-emitting component as claimed in claim 7, wherein said current spreading layer includes one of GaP, GaAs, and AlGaInP.

9. The light-emitting component as claimed in claim 7, wherein said fluorine-containing region has a thickness not greater than that of said current spreading layer.

10. The light-emitting component as claimed in claim 7, wherein said fluorine-containing region has a thickness greater than that of said current spreading layer.

11. The light-emitting component as claimed in claim 1, further comprising a first electrode disposed on an upper surface of said first semiconductor layer opposite to said active layer, said first electrode including a main pad electrode for an external electrical connection,
    wherein a portion of said fluorine-containing region is located in alignment with said main pad electrode in the stacking direction.

12. The light-emitting component as claimed in claim 1, further comprising a first electrode disposed on an upper surface of said first semiconductor layer opposite to said active layer, said first electrode including a main pad electrode for an external electrical connection,
    wherein said fluorine-containing region is located in alignment with said main pad electrode in the stacking direction.

13. The light-emitting component as claimed in claim 1, wherein each of said first semiconductor layer, said active layer, and said second semiconductor layer includes one of $Al_xIn_yGa_{1-x-y}P$ and $Al_zGa_{1-z}As$, in which $0 \leq x \leq 1$, $0 \leq y \leq 1$, and $0 \leq z \leq 1$.

14. The light-emitting component as claimed in claim 1, wherein:
    said electrically insulating layer has a plurality of through holes extending in the stacking direction such that said lower surface of said second semiconductor layer exposed from said plurality of through holes serves as said second portion.

15. The light-emitting component as claimed in claim 14, further comprising:
    a second electrode disposed at a side of said electrically insulating layer distal from said light-emitting unit; and
    an ohmic contact layer disposed to electrically connect said second electrode with said second portion of said lower surface of said second semiconductor layer through said plurality of through holes of said electrically insulating layer, said ohmic contact layer being a transparent conductive layer.

16. The light-emitting component as claimed in claim 14, further comprising:
    a second electrode disposed at a side of said electrically insulating layer distal from said light-emitting unit; and
    an ohmic contact layer disposed to electrically connect said second electrode with said second portion of said lower surface of said second semiconductor layer through said plurality of through holes of said electrically insulating layer, said ohmic contact layer including at least two different metals.

17. The light-emitting component as claimed in claim 14, further comprising:
a second electrode disposed at a side of said electrically insulating layer distal from said light-emitting unit; and
a metallic reflective layer disposed between said second electrode and said electrically insulating layer to reflect light from said second semiconductor layer.

* * * * *